United States Patent
Kondo et al.

[11] Patent Number: 6,152,283
[45] Date of Patent: *Nov. 28, 2000

[54] CIRCUIT-COMPONENT SUPPLYING METHOD AND CIRCUIT-COMPONENT FEEDER

[75] Inventors: Yoshiyuki Kondo; Koichi Asai, both of Nagoya, Japan

[73] Assignee: Fuji Machine Mfg. Co., Ltd., Chiryu, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/106,703

[22] Filed: Jun. 29, 1998

[30] Foreign Application Priority Data

Jul. 2, 1997 [JP] Japan .................................. 9-177414

[51] Int. Cl.$^7$ ................................................ B65G 47/14
[52] U.S. Cl. .................... 198/396; 198/380; 198/463.5; 198/468.2; 198/468.4; 198/577; 198/832.1; 198/860.5; 414/415; 414/416
[58] Field of Search .................... 198/396, 380, 198/463.5, 464.2, 468.2, 468.4, 577, 832.1, 832.2, 860.5; 414/403, 415, 416

[56] References Cited

U.S. PATENT DOCUMENTS

| | | | |
|---|---|---|---|
| 5,070,988 | 12/1991 | Konishi et al. .................... | 198/380 |
| 5,636,725 | 6/1997 | Saito et al. ....................... | 198/396 |
| 5,658,122 | 8/1997 | Ohashi et al. . | |
| 5,755,548 | 5/1998 | Gaasch et al. .................... | 198/832.1 |
| 5,934,866 | 8/1999 | Redden ............................ | 198/577 |

FOREIGN PATENT DOCUMENTS 6-232596  8/1994  Japan .

*Primary Examiner*—Joseph E. Valenza
*Attorney, Agent, or Firm*—Oliff & Berridge, PLC

[57] ABSTRACT

A circuit-component feeder, including an endless belt having an outer surface a portion of which provides a component-carry surface, a stopper disposed adjacent to the component-carry surface, a component lining-up device which lines up, on the component-carry surface, a plurality of circuit components in a lengthwise direction of the component-carry surface such that the lined-up components are close to each other, and a belt driving device which circulates the belt in one of opposite directions thereof by a first predetermined amount sufficient for a leading one of the lined-up components to be moved and stopped by the stopper, and subsequently circulates the belt in the other direction thereof by a second predetermined amount smaller than the first predetermined amount.

20 Claims, 11 Drawing Sheets

CIRCUIT-COMPONENT SUPPLYING METHOD AND CIRCUIT-COMPONENT FEEDER

BACKGROUND OF THE INVENTION

1. Field of the Invention

The present invention relates to a method of supplying circuit components, such as electric-circuit or electronic-circuit components, and a feeder for feeding circuit components.

2. Related Art Statement

Japanese Patent Application laid open for inspection purposes under Publication No. 6(1994)-232596 discloses a feeder which lines up circuit components in bulk, into an array of components on a component-carry surface of an endless belt, and moves the belt, thereby feeding and supplying the components. This circuit-component feeder includes a storing box which stores the circuit components; a component-take pipe whose upper end portion projects into an inside space of the storing box and which is moved up and down so that the components stored in the box fall into the component-take pipe; and a component-feed pipe which is connected to the component-take pipe and which feeds the components onto the component-carry surface of the endless belt. When the endless belt is driven and the component-carry surface is moved, the circuit components are fed forward so that the leading one of the components is stopped by a stopper. The stopper is moved by a stopper moving device to its operative position where the stopper stops the forward movement of the leading component and to its inoperative position away from the operative position. When the circuit components are fed by the endless belt, the stopper has been moved to its operative position. After the leading component is stopped by the stopper, a suction nozzle sucks the leading component, the stopper is retracted to its inoperative position, and the suction nozzle lifts up the component from the component-carry surface of the belt. Since the stopper has been retracted away from the leading component, the component is not sandwiched between the stopper and the following or second component and accordingly the suction nozzle can easily pick up the leading component.

However, the prior feeder needs the stopper moving device which moves the stopper to its operative and inoperative positions, and accordingly the construction of the feeder is complex and the production cost of the same is high.

SUMMARY OF THE INVENTION

It is therefore an object of the present invention to provide a circuit-component supplying method in which a circuit component is easily moved away from a stopper and which is performed at low cost.

It is another object of the present invention to provide a circuit-component feeder in which a circuit component is easily moved away from a stopper and which is produced at low cost.

The present invention provides a circuit-component supplying method and a circuit-component feeder which have one or more of the technical features which are described below in respective paragraphs given parenthesized sequential numbers (1) to (18). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a method of supplying a plurality of circuit components, comprising the steps of lining up, on a component-carry surface of an endless belt, the circuit components in a lengthwise direction of the component-carry surface such that the lined-up components are close to each other, circulating the belt in one of opposite directions so that the component-carry surface is moved in a forward direction and a leading one of the lined-up components is stopped by a stopper, and circulating the belt in the other direction so that the component-carry surface is moved by a predetermined distance in a backward direction and the leading component is moved away from the stopper. When the component-carry surface is moved in the forward direction, the leading one of the components which are lined up on the carry surface such that the components are close to each other, is stopped by the stopper, and then when the carry surface is moved by the predetermined distance in the backward direction, the leading component is moved away from the stopper. Since the carry surface is moved by the predetermined distance in the backward direction, the distance of movement of each component from the stopper does not change. That is, each component is positioned at a predetermined position where the component is not sandwiched between the stopper and the following or second component. Therefore, each component is easily taken out. Each component may be moved away from the stopper at any time between the time when the component is stopped by the stopper and the time when the component is taken out. In the present method, the leading component is moved away from the stopper by moving, in the backward direction, the component-carry surface which is for feeding the components forward. Therefore, the present method does not need a stopper moving device. Thus, the present method allows each component to be easily moved away from the stopper, and is performed at low cost. The present method may employ one or more of the technical features (3) to (18) which will be described below in connection with the circuit-component feeder according to the second feature (2).

(2) According to a second feature of the present invention, there is provided a circuit-component feeder, comprising an endless belt having an outer surface a portion of which provides a component-carry surface, a stopper disposed adjacent to the component-carry surface, a component lining-up device which lines up, on the component-carry surface, a plurality of circuit components in a lengthwise direction of the component-carry surface such that the lined-up components are close to each other, and a belt driving device which circulates the belt in one of opposite directions thereof by a first predetermined amount sufficient for a leading one of the lined-up components to be moved and stopped by the stopper, and subsequently circulates the belt in the other direction thereof by a second predetermined amount smaller than the first predetermined amount. When the endless belt is circulated in one (i.e., forward) direction thereof, the leading component is moved and stopped by the stopper; and then, when the belt is circulated in the other (i.e., backward) direction thereof, the leading component is moved away from the stopper. Each component may be moved away from the stopper at any time between the time when the component is stopped by the stopper and the time when the component is taken out. In the present feeder, the leading component is moved away from the stopper by utilizing the belt driving device which is for feeding the components forward. Therefore, the present feeder does not need a stopper moving device. Thus, the present feeder has a simple construction for moving each component away from the stopper, and accordingly is produced at low cost. Since the construction of the present feeder is simple, the weight of the feeder is low. In the case where a plurality of circuit-component feeders are attached to a feeder support table, such that respective component-supply portions of the feeders are arranged along a single line, and the feeder support table is moved in a direction parallel to the line so that the respective component-supply portions are sequentially positioned at a component supplying position where at least one circuit component is supplied from the each component-supply portion, the acceleration and deceleration of movement of each feeder can be increased to improve the efficiency of supplying of components. Alternatively, the vibration of each feeder can be decreased to improve the accuracy of supplying of components, without increasing the acceleration and deceleration of the each feeder. The belt driving device may be one, according to the third feature (3), which is provided by a ratchet wheel, etc. and which mechanically defines the respective amounts of circulation of the endless belt in the forward and backward directions; or one, according to the sixth feature (6), which includes, as its drive source, an electric motor, such as a servomotor or a stepper motor, which is controllable with respect to its rotation angle and its rotation direction and which electrically defines the respective amounts of circulation of the endless belt in the forward and backward directions.

(3) According to a third feature of the present invention which includes the second feature (2), the belt driving device comprises a drive pulley on which the endless belt is wound; a ratchet wheel which is associated with the drive pulley such that respective rotations of the ratchet wheel in opposite directions thereof are transmitted to the drive pulley; a driving mechanism which includes a pivotable member which is pivotable in opposite directions thereof and thereby reciprocatable for rotating the ratchet wheel in one of the opposite directions thereof; and a driving pawl which is supported by the pivotable member and which engages teeth of the ratchet wheel such that when the pivotable member is pivoted in one of the opposite directions thereof, the driving pawl does not move over any of the teeth of the ratchet wheel so that the ratchet wheel is rotated in the one direction thereof and, when the pivotable member is pivoted in the other direction thereof, the driving pawl moves over at least one of the teeth of the ratchet wheel so that the ratchet wheel is not rotated; and a positioning pawl which engages the teeth of the ratchet wheel to rotate the ratchet wheel in the other direction thereof to an angular position away by a predetermined angle from an angular position to which the ratchet wheel is rotated in the one direction thereof by the driving mechanism. When the pivotable member is pivoted in one (i.e., forward) direction thereof, the driving pawl is pivoted, while being engaged with the teeth of the ratchet wheel, in its forward direction about an axis line about which the pivotable member is pivoted. Thus, the ratchet wheel is rotated in one (i.e., forward) direction thereof and the drive pulley is rotated in its forward direction, so that the endless belt is circulated in its forward direction and the leading one of the circuit components lined up on the component-carry surface is moved and stopped by the stopper. After the rotation of the ratchet wheel in the forward direction is stopped by the driving mechanism, the positioning pawl engages the teeth of the ratchet wheel to rotate the wheel in the other (i.e., backward) direction thereof to an angular position away by a predetermined angle from the angular position where the wheel is stopped by the driving mechanism. Consequently the leading component is moved away from the stopper. On the other hand, when the pivotable member is pivoted in the other (i.e., backward) direction thereof, the driving pawl is moved over at least one of the teeth of the ratchet wheel and is pivoted in its backward direction about the axis line about which the pivotable member is pivoted. It is preferred that the positioning pawl be one which engages the teeth of the ratchet wheel such that when the ratchet wheel is rotated in its forward direction, the positioning pawl can move over the teeth of the wheel, but when the wheel is rotated in its backward direction, the pawl cannot move over the teeth of the wheel. In this preferred case, the positioning pawl also functions as a preventing pawl which prevents the ratchet wheel from being rotated in its backward direction. In this case, when the pivotable member is pivoted in its backward direction and accordingly the driving pawl is pivoted in its backward direction, the positioning pawl prevents the ratchet wheel from being rotated in its backward direction. The positioning pawl is provided such that in the state in which the rotation of the ratchet wheel in the forward direction is stopped, the positioning pawl does not engage both of two adjacent teeth of the ratchet wheel and, in the state in which the wheel has been rotated in its backward direction by the predetermined angle from the angular position where the wheel is stopped, the pawl engages both of the two adjacent teeth of the wheel. The rotation of the ratchet wheel in the backward direction causes the endless belt to be circulated in its backward direction, so that the component-carry surface is moved in its backward direction and the leading component is moved away from the stopper. The positioning pawl may be one, according to the fourth feature (4), which is not elastically deformable and which is biased by a biasing device in a direction to engage the teeth of the ratchet wheel; or one which is elastically deformable and which is biased by its own elastic force in a direction to engage the teeth of the ratchet wheel. The present feeder may employ a preventing pawl which prevents the ratchet wheel from being rotated in its backward direction and which is separate from the positioning pawl. In this case, the feeder may additionally employ a moving device which moves the positioning pawl to its operative position where the pawl engages the teeth of the ratchet wheel and rotates the wheel in its backward direction by the predetermined angle from the angular position where the wheel is stopped, and to its inoperative position where the pawl does not engage the wheel. When the wheel is rotated in its forward direction, the pawl is positioned at its inoperative position to allow the wheel to be rotated in its forward direction and stopped. When the pivotable member is pivoted in its backward direction, the preventing pawl prevents the ratchet wheel from being rotated in its backward direction such that the preventing pawl stops the rotation of the ratchet wheel in the backward direction, at an angular position away by a predetermined angle from an angular position where the wheel is stopped by the positioning pawl positioned at its operative position. Therefore, when the positioning pawl is moved to its operative position to engage the teeth of the wheel, the pawl rotates the wheel in its forward direction so that the wheel is stopped at an angular position away by a predetermined angle from an angular position where the rotation of the wheel in its forward direction is stopped. That is, the endless belt is moved in its backward direction by the preventing pawl and then is moved in its forward direction by the positioning pawl. Eventually the leading component is moved away from the stopper. Whether the preventing pawl may be provided by the positioning pawl or a member separate from the positioning pawl, the positioning pawl engages two adjacent teeth of the ratchet wheel and thereby positions the wheel in both of its forward and backward directions. Therefore, when the leading component is taken out by a component holder such as a component suction nozzle, the component-carry surface is effectively prevented from being moved. Thus, each component is taken out with high reliability. Though the first amount by which the endless belt is circulated in its forward direction depends on the number of teeth of the ratchet wheel over which the driving pawl moves when the pivotable member is pivoted in its backward direction, the first amount is determined at a value greater than the dimension of each component in a direction in which the components are fed on the component-carry surface, so that the leading component can surely strike against the stopper. An excessive amount of circulation of the belt is accommodated by the sliding of the leading component on the belt. Even if a small space may be left between the second and third components and so on, that space will be eliminated by the sliding of the leading component, so that the components lined up on the carry surface become close to each other. A drive source which drives the ratchet wheel may be one which is independent of the feeder, or one which is exclusive for the feeder. In the former case, for example, in the case where the present feeder is employed in a circuit-component mounting system which additionally includes (a) a rotatable table having a plurality of component suction heads as a plurality of component holder heads such that the suction heads are equiangularly spaced from each other about an axis line of rotation of the table and (b) a rotating device which intermittently rotates the rotatable table about the axis line, the feeder and the rotating device may share a common drive source, for reducing the total number of drive sources. In the latter case, for example, the feeder may employ, as the exclusive drive source, an air-cylinder device as a sort of fluid-pressure-operated cylinder device as a sort of fluid-pressure-operated actuator, or an electric motor. In either case, it is possible to move each component away from the stopper at any time between the time when the component is stopped by the stopper and the time when the component is taken out. Meanwhile, in the case where a plurality of circuit-component feeders are employed in a circuit-component supplying apparatus, the feeders and devices other than the supplying apparatus may share a common drive source; the feeders may share a common drive source; or each feeder may employ its exclusive drive source. The first predetermined amount by which the endless belt is circulated in its forward direction may be an adjustable one, or a fixed one. In the former case, for example, the number of teeth of the ratchet wheel over which the driving pawl moves is adjusted. In the latter case, no adjusting mechanism is needed, which contributes to simplify the construction of the feeder and thereby reduce the weight of the same. The feeder according to the third feature (3) enjoys the advantage of moving the leading component from the stopper by selecting an appropriate position where the positioning pawl is provided.

(4) According to a fourth feature of the present invention which includes the third feature (3), the pivotable member comprises a first pivotable member which is pivotable about a first axis line about which the ratchet wheel is rotatable, and the driving pawl is attached to the first pivotable member such that the driving pawl is pivotable about a second axis line parallel to the first axis line, wherein the driving mechanism further comprises a first biasing device which biases the driving pawl in a direction to engage the teeth of the ratchet wheel, and wherein the belt driving device further comprises a second pivotable member which is pivotable about a third axis line parallel to the first axis line and which supports the positioning pawl; and a second biasing device which biases the second pivotable member in a direction in which the positioning pawl engages the teeth of the ratchet wheel. The positioning pawl may be provided by an integral portion of the second pivotable member, or a member which is separate from the second pivotable member and which is fixed thereto by a fixing device.

(5) According to a fifth feature of the present invention which includes the third or fourth feature (3) or (4), the drive pulley and the ratchet wheel are provided by an integral rotatable member. Alternatively, it is possible that the drive pulley and the ratchet wheel be provided by two separate members, respectively, and that a rotation transmitting mechanism which transmits the respective rotations of the drive pulley to the ratchet wheel be provided between the drive pulley and the ratchet wheel. However, the feeder according to the fifth feature (5) enjoys a simple construction. The integral rotatable member may be initially manufactured as separate members which then are fixed to each other such that the two members are not rotatable relative to each other, or may be initially manufactured as a literally integral member.

(6) According to a sixth feature of the present invention which includes the second feature (2), the belt driving device comprises a drive pulley on which the endless belt is wound; and an electric motor which rotates the drive pulley in opposite directions thereof.

(7) According to a seventh feature of the present invention which includes the sixth feature (6), the belt driving device further comprises a control device which controls the electric motor to rotate the drive pulley such that the belt is circulated in the one direction thereof by the first predetermined amount and is subsequently circulated in the other direction thereof by the second predetermined amount smaller than the first predetermined amount.

(8) According to an eighth feature of the present invention which includes any one of the second to seventh features (2) to (7), the component-carry surface of the endless belt comprises an upper surface of an upper flat portion of the endless belt, and wherein the feeder comprises a main body which has a pair of belt guide surfaces which guide opposite side surfaces of the flat portion of the belt, respectively; a belt support surface which supports a lower surface of the flat portion of the belt which is opposite to the component-carry surface thereof; and a pair of component guide surfaces which guide opposite side surfaces of each of the circuit components lined up on the component-carry surface, the opposite side surfaces of the each circuit component being parallel to a direction in which the each circuit component is moved by the belt. The pair of belt guide surfaces and the belt support surface, and the pair of component guide surfaces may be provided by two separate members, respectively, as in the feeder according to the ninth feature (9), or may be provided by a single member. In the latter case, for example, the main body may include a main member having a stepped guide groove which has an upper opening and includes an upper narrow portion and a lower wide portion. The opposed side surfaces and bottom surface of the wide portion provide the pair of belt guide surfaces and the belt support surface, respectively, and the opposed side surfaces of the narrow portion provide the pair of component guide surfaces. The upper opening of the guide groove may, or may not, be covered by a cover member.

(9) According to a ninth feature of the present invention which includes the eighth feature (8), the main body comprises a main member which has a first guide groove which opens upward and has a rectangular cross section, the belt guide surfaces comprising opposed surfaces of the main member which are opposed to each other and cooperate with each other to define the guide groove, the belt support surface comprising a bottom surface which cooperates with the opposed surfaces to define the first guide groove, and wherein the main body further comprises a fixed cover member which is fixed to the main member to cover an upper opening of the first guide groove, the fixed cover member having a second guide groove which opens in a surface thereof opposed to the first guide groove, the component guide surfaces comprising opposed surfaces of the fixed cover member which are opposed to each other and cooperate with each other to define the second guide groove. In the present feeder, the fixed cover member prevents the components from jumping out. The second guide groove of the fixed cover member has a width corresponding to the dimension of each component. In the case where the present feeder is required to feed different sorts of circuit components having different widths, it is possible to select an appropriate one of a plurality of fixed cover members whose second guide grooves have different widths and fix the selected cover member to the main member. The present feeder may employ a positioning device which positions the fixed cover member and the main member in the direction of width of the two guide grooves. For example, one of the fixed cover member and the main member has one or more positioning holes and the other member has one or more positioning projections which are fitted in the positioning holes, respectively, to position the second guide groove relative to the endless belt fitted in the first guide groove, in the direction of width of the grooves. Meanwhile, it can be additionally said that the main body may include a main member having a stepped guide groove which has a lower opening and includes an upper narrow portion and a lower wide portion. In this case, the opposed side surfaces of the wide portion provide the pair of belt guide surfaces, and the opposed side surfaces of the narrow portion provide the pair of component guide surfaces. In the case where the belt support surface is not needed, the lower opening of the stepped guide groove may not be closed; and in the case where the belt support surface is needed, the belt support surface may be provided by a member which closes the lower opening of the stepped guide groove.

(10) According to a tenth feature of the present invention which includes any one of the second to ninth features (2) to (9), the circuit-component feeder further comprises a movable cover member which normally takes a closed position where the movable cover member covers a portion of the component-carry surface of the endless belt which is adjacent to the stopper and takes, when each of the circuit components is taken from the feeder, an opened position where the movable cover member permits the each circuit component to be taken from the feeder. Since the leading component is covered by the movable cover member before the component is taken out, the component is prevented from jumping out, and accordingly is supplied with reliability. In the case where the above-described fixed cover member is employed as well, each component is also covered when the component is being fed. Since the component is prevented from jumping out, it can be supplied with reliability. The movable cover member may have a notch which allows a component suction nozzle as a component holder to pass therethrough. In the last case, after the suction nozzle passes through the notch and holds, by suction, the leading component, the movable cover member is moved to its opened position where the movable cover member permits the leading component to be take out by the suction nozzle.

(11) According to an eleventh feature of the present invention which includes any one of the second to tenth features (2) to (10), the belt comprises a timing belt. Since the timing belt can be circulated by the second predetermined amount in its backward direction by the belt driving device, the leading component is surely moved away from the stopper. The timing belt may be a cog belt.

(12) According to a twelfth feature of the present invention which includes any one of the second to eleventh features (2) to (11), the component lining-up device comprises a storing chamber in which the circuit components to be supplied are stored in bulk, the storing chamber having an outlet through which the circuit components are fed; a supply passage having an inlet and an outlet; and an arranging device which is provided between the storing device and the supply passage and which arranges the circuit components fed from the outlet of the storing device, into an array of the components, and supplies the array of the components to the inlet of the supply passage. The circuit components can be moved from the inlet of the supply passage toward the outlet thereof, by, e.g., generating an air flow in the supply passage, vibrating the supply passage, or using an inclined passage as the supply passage. In the case where the inclined passage is used as the supply passage, the passage may have a downslope whose height gradually decreases from the inlet toward the outlet. In the case where the components are moved by the air flow or the vibration, the supply passage may be horizontal, or may have an upslope whose height increased from the inlet toward the outlet, or a downslope. The components may be moved by generating the air flow in the supply passage while vibrating the same, or by generating the air flow in the downslope supply passage while vibrating the same. The arranging device may be one, according to the thirteenth feature (13), which arranges the components by blowing air, or one which arranges the components by, e.g., vibrating the components.
(13) According to a thirteenth feature of the present invention which includes the twelfth feature (12), the arranging device comprises a component-stirring air blower which blows air for stirring the in-bulk circuit components and thereby arranging the circuit components into the array of the components.

(14) According to a fourteenth feature of the present invention which includes the twelfth or thirteenth feature (12) or (13), the arranging device comprises at least one component-stirring room which is provided between the outlet of the storing device and the inlet of the supply passage; and a component-stirring air blower which has, near the inlet of the supply passage, at least one opening for blowing air in a direction having a component toward the component-stirring room and thereby stirring the in-bulk circuit components. The circuit components stored in the storing device are introduced into the component-stirring room, while being disciplined, and then are blown up and stirred by the air blown through the opening of the air blower. When the components being stirred by the air fall, those enter one by one the inlet of the supply passage.

(15) According to a fifteenth feature of the present invention which includes any one of the twelfth to fourteenth features (12) to (14), the arranging device comprises a component-feeding air blower having at least one opening which opens in the supply passage and which blows air in a direction having a component toward the outlet of the supply passage. The circuit components present in the supply passage are moved toward the outlet thereof by the air blown from the opening of the component-feeding air blower.

(16) According to a sixteenth feature of the present invention which includes the fifteenth feature (15), the component lining-up device further comprises an air reliever which is provided between the component-feeding air blower and the outlet of the supply passage and which relieves the air blown by the air blower, into an outside space, the air reliever being different from a space left between the circuit components and the supply passage. Since the air reliever is combined with the component-feeding air blower, the air reliever relieves the air blown from the air blower, into the outside space. The component-feeding air blower blows air in a direction having a component toward the outlet of the supply passage, and the air reliever is provided between the air blower and the outlet of the supply passage, so that an air flow is generated toward the outlet of the supply passage. Since the air is relieved by the air reliever, a sufficiently large amount of air is flown at a sufficiently high speed from the air blower. In the case where the air reliever is provided at the middle of the supply passage, only a small air flow or no air flow is generated in a first room between the air reliever and the outlet of the supply passage, so that the components present in the first room does not receive any feeding force of the air flow generated by the air blower. However, the feeding force received by the components present in a second room between the air reliever and the air blower is transmitted to the components present in the first room. Thus, the components are fed forward as a whole without any problems.

(17) According to a seventeenth feature of the present invention which includes the sixteenth feature (16), the air reliever comprises at least one air-relieving hole which is formed through a thickness of a wall defining the supply passage and which communicates the supply passage with the outside space. In the present feeder, the air blown by the component-feeding air blower is relieved into the outside space via the air-relieving hole. It is easy to form the air-relieving hole through the thickness of the wall defining the supply passage. Thus, the air reliever is easily provided.

(18) According to an eighteenth feature of the present invention which includes any one of the third to seventeenth features (3) to (17), the circuit-component feeder further comprises a movable cover member which normally covers a portion of the component-carry surface of the endless belt that is adjacent to the stopper and which is opened, when each of the circuit components is taken from the feeder, to permit the each circuit component to be taken from the feeder; and a synchronizing mechanism which synchronizes the opening of the movable cover member with the pivotal movement of the pivotable member in the other direction thereof. The synchronizing mechanism may be provided by a portion of a drive mechanism which drives or rotates the ratchet wheel, as will be described by reference to the preferred embodiment of the present invention, or by an exclusive member which is separate from the drive mechanism and which opens the movable cover member in synchronism with the operation of the drive mechanism.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

There will be described in detail a circuit-component ("CC") mounting system 8 including a plurality of CC feeders 12 to each of which the present invention is applied.

Figure 1:
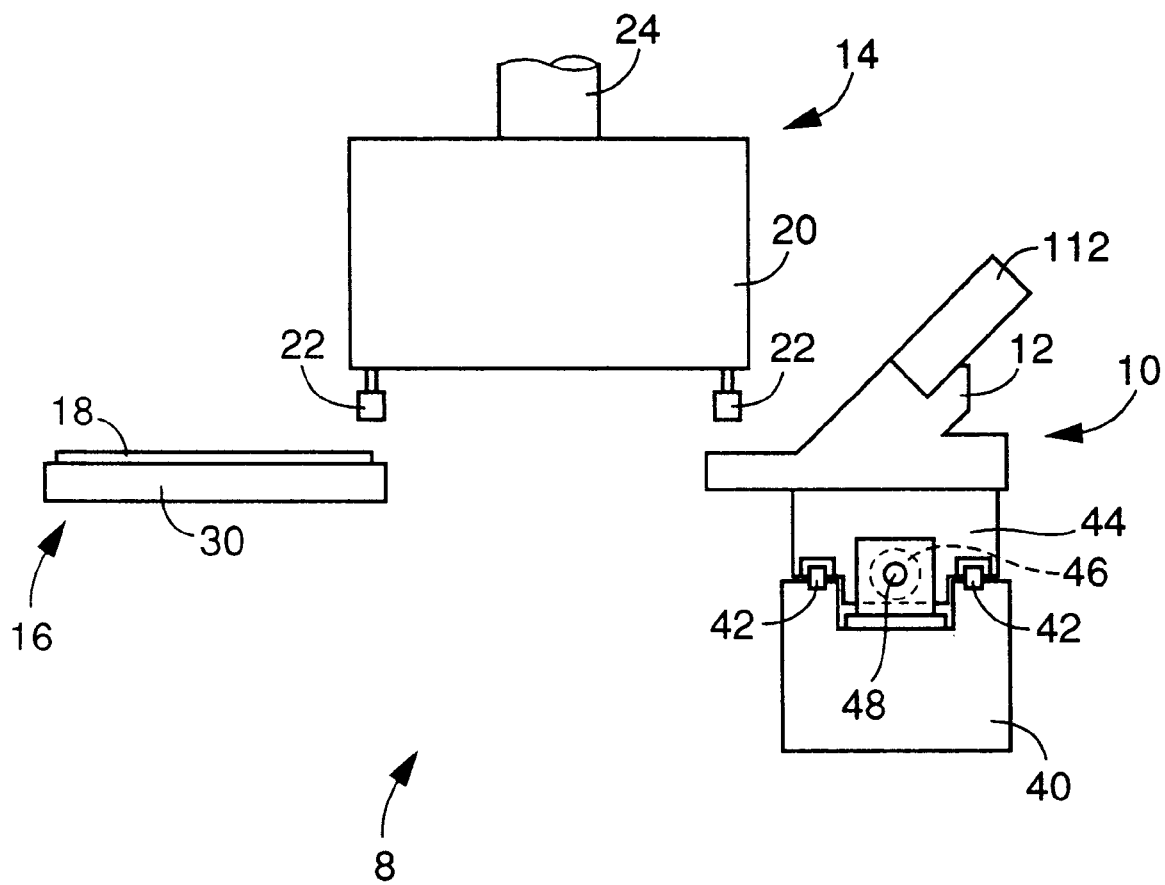
FIG. 1 is a schematic front elevation view of a circuit-component ("CC") mounting system including a CC supplying device including a plurality of CC feeders to each of which the present invention is applied.

In FIG. 1, reference numeral 10 designates a CC supplying device including a plurality of CC feeders 12 (only one feeder 12 is shown in the figure). Each of the CC feeders 12 supplies one or more circuit components 110 ("CC" or "CCs", FIG. 9) to a CC mounting device 14 as a sort of CC take-out device, and the CC mounting device 14 mounts the CCs 110 on a printed circuit board ("PCB") 18 as a sort of circuit substrate which is positioned and supported by a PCB positioning and supporting device 16.

The CC mounting device 14 includes an index table 20 which is intermittently rotatable about a vertical axis line. The index table 20 includes twelve CC-suck heads 22 (only two heads 22 are shown in the figure) each as a sort of CC holder, and is intermittently rotated by an intermittently rotating device which is provided by a cam and a cam follower (not shown), a rotatable axis member 24, and an index-table servomotor 26 (FIG. 2) which rotates the cam. More specifically described, the twelve CC-suck heads 22 are sequentially moved to, and stopped at, a CC sucking position, a CC-attitude detecting position, a CC-attitude correcting position, and a CC mounting position. The CC-suck heads 22 are supported by the index table 20 such that each head 22 is movable up and down. A head elevating and lowering device (not shown) which elevates and lowers each CC-suck head 22 is provided at each of the CC sucking position and the CC mounting position. More specifically described, the rotation of the index-table servomotor 26 is converted by a motion converting device which is provided by a cam, a cam follower, etc. (not shown), into the upward and downward movement of an elevator member (not shown), which causes each CC-suck head 22 to move up and down. The index-table servomotor 26 is an electric motor as a sort of a driving device that is controllable with respect to its angular phase. The servomotor 26 may be replaced by a stepper motor.

The PCB positioning and supporting device 16 includes a PCB-support table 30 which positions and supports the PCB 18. The PCB-support table 30 is provided on an X-Y table (not shown) which is movable, in a horizontal plane, in an X-axis direction (i.e., a direction perpendicular to the drawing sheet of FIG. 1) and a Y direction (i.e., in a left-right direction in FIG. 1) perpendicular a the X-axis direction. Owing to the X-Y table, the PCB 18 is movable to any position in the horizontal plane. The PCB 18 is carried in a direction parallel to the X-axis direction, and carried in onto the PCB-support table 30 by a carry-in device (not shown) and carried out from the table 30 by a carry-out device (not shown). When the CC mounting device 14 mounts the CCs 110 on the PCB 18, the PCB 18 is moved by the X-Y table so that each of a plurality of predetermined CC-mount positions on the PCB 18 is positioned right below the CC-suck head 22 being positioned at the CC mounting position and so that the head 22 mounts the CC 110 being held thereby, at the each CC-mount position on the PCB 18.

Next, there will be described the CC supplying device 10.

The CC supplying device 10 includes a base member 40 on which a pair of guide rails 42 extend parallel to the X-axis direction and an X-axis slide 44 fits on the guide rails 42 such that the X-axis slide 44 is movable in the X-axis direction. The plurality of CC feeders 12 are attached to the X-axis slide 44 such that a CC feeding direction in which each feeder 12 feeds each CC 110 is parallel to the Y-axis direction and such that respective CC-take-out portions of the CC feeders 12 are arranged along a straight line parallel to the X-axis direction. The CC-take-out portion of each CC feeder 12 can be said as a CC-supply portion thereof. A nut 46 is fixed to the X-axis slide 44, and is threadedly engaged with a feed screw 48 which is supported by the base member 40 such that the feed screw 48 is not movable in an axial direction thereof and is rotatable about an axis line thereof. When the feed screw 18 is rotated by an appropriate amount by an X-axis servomotor 50 (FIG. 2), the X-axis slide 44 is moved in the X-axis direction so that the CC-take-out portion of an appropriate one of the CC feeders 12 is selectively positioned at a CC supplying position, right below the CC-suck head 22 being positioned at the CC sucking position, where the one CC feeder 12 supplies one or more CCs 110 to one or more CC-suck heads 22 of the CC mounting device 14. Thus, the X-axis slide 44, the nut 46, the feed screw 48, and the X-axis servomotor 50 cooperate with one another to provide a movable table.

Figure 2:
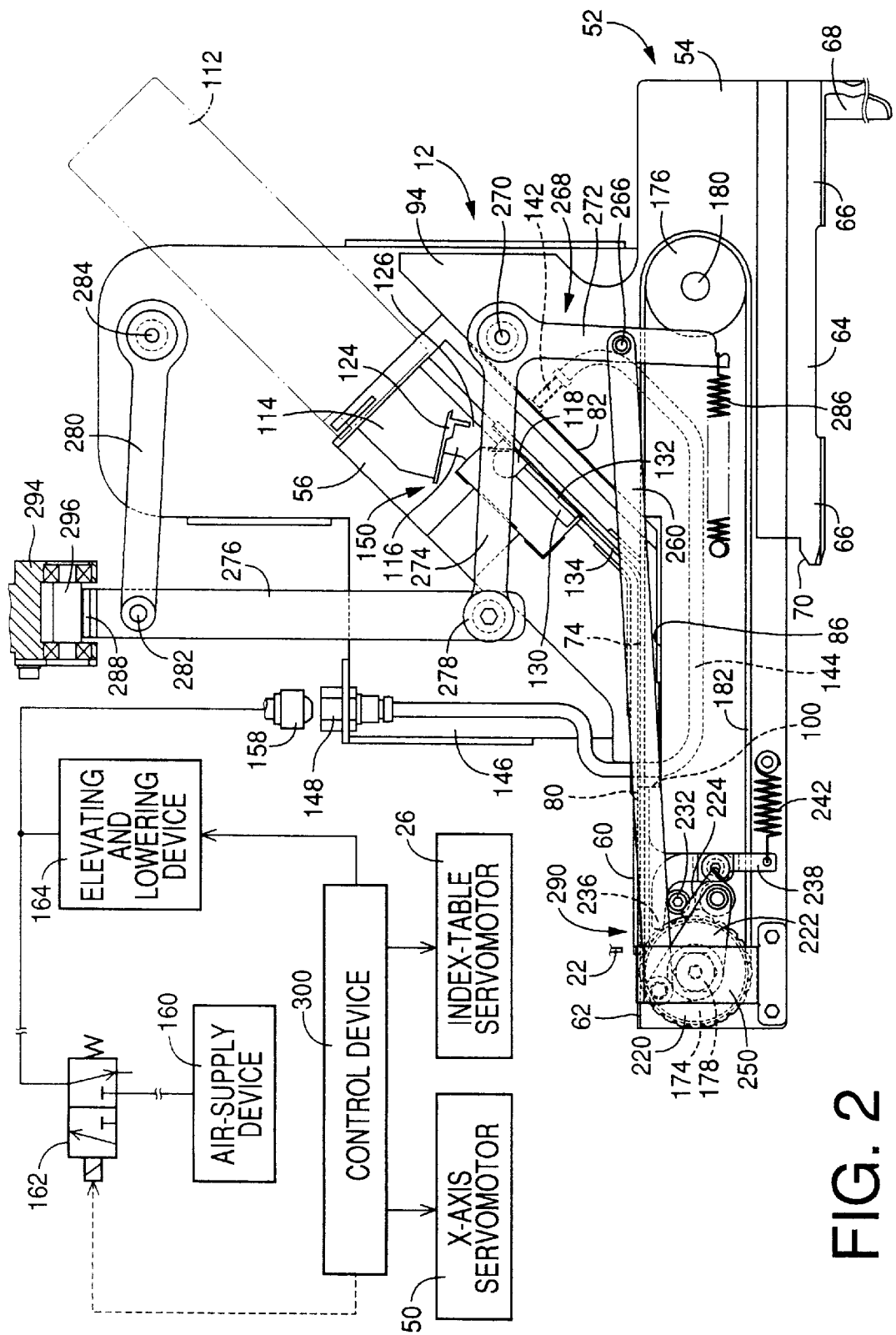
FIG. 2 is a front elevation view of each CC feeder of FIG. 1.
Figure 5:
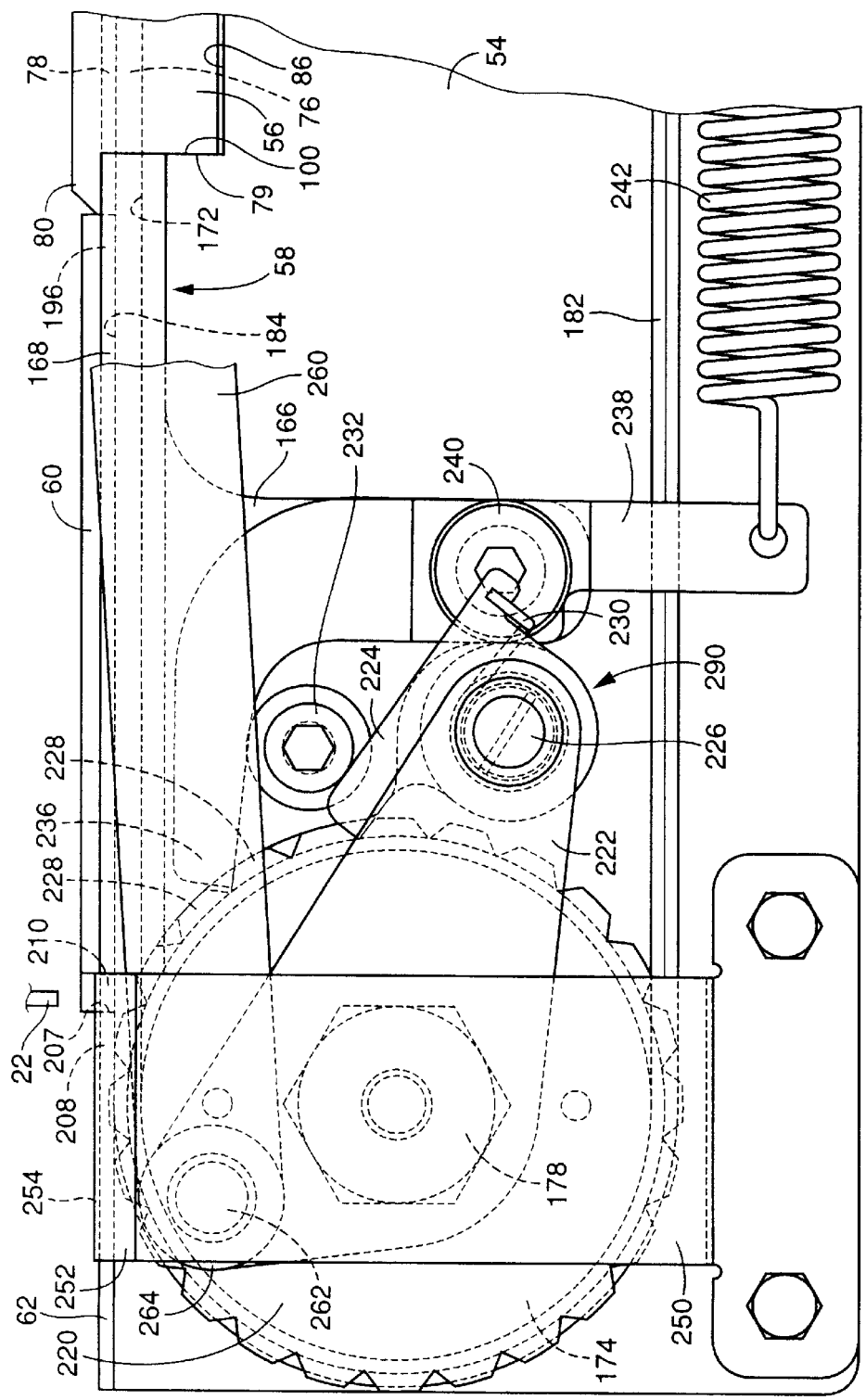
FIG. 5 is a front elevation view showing a CC-take-out portion of the CC feeder.
Figures 7, 8:
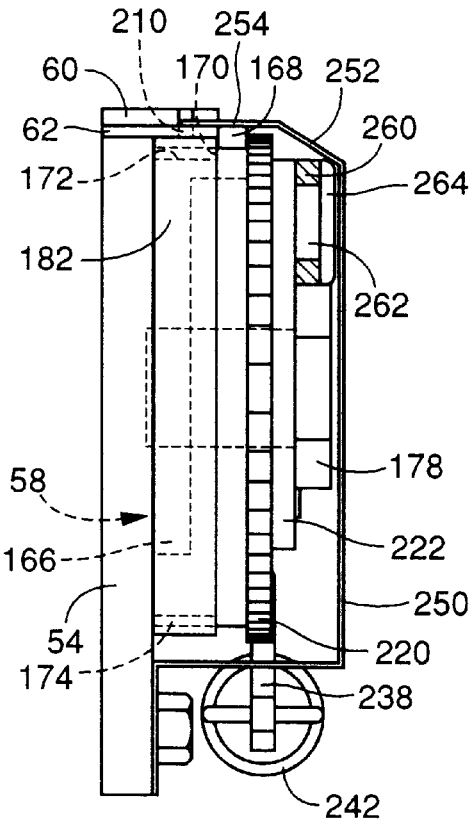
FIG. 7 is a side elevation view showing the CC-take-out portion of the CC feeder.
FIG. 8 is a cross-sectioned, side elevation view showing another guide groove formed in a first and a third member as elements of the main body of the CC feeder, together with the CC-carry belt.

Each CC feeder 12 includes a main body 52 which is assembled, for easier manufacturing thereof, from a plurality of members. As shown in FIGS. 2, 5, and 7, the main body 52 includes a first, a second, a third, a fourth, and a fifth member 54, 56, 58, 60, 62. The first member 54 has a generally elongate plate-like configuration, and its lengthwise direction is parallel, in the horizontal plane, to the CC feeding direction, i.e., the Y-axis direction and its widthwise direction is perpendicular to the CC feeding direction and is parallel to the X-axis direction. The respective first members 54 of the CC feeders 12 stand upright on the X-axis slide 44 in the above-described state in which the respective CC-take-out portions of the CC feeders 12 are arranged along the straight line parallel to the X-axis direction.

The first member 54 of each CC feeder 12 is attached to the X-axis slide 44 by an attaching device similar to an attaching device which is employed, in a CC supplying device disclosed in U.S. Pat. No. 5,658,122, for attaching a CC supplying cartridge to a cartridge-support member. The disclosure of the U.S. patent is incorporated herein by reference. The attaching device will be described briefly below.

As shown in FIG. 2, a positioning block 64 is fixed to a rear half portion of a lower portion of the first member 54, such that the positioning block 64 extends parallel to the lengthwise direction of the first member 54. The rear half portion of the first member 54 is an upstream half portion thereof as seen in the CC feeding direction, and is more remote from the CC mounting device 14 than a front half portion thereof in the state in which the first member 54 is attached the X-axis slide 44. Two first positioning projections 66 project from two locations of a lower side of the positioning block 64, respectively, which are apart from each other in the lengthwise direction of the first member 54. The first positioning projections 66 extend parallel to the lengthwise direction. A single second positioning projection 68 projects vertically downward from a rear end portion of the positioning block 64.

The two first positioning projections 66 fit in two positioning grooves (not shown), respectively, which are formed in an upper surface of the X-axis slide 44 such that the positioning grooves extend parallel to the Y-axis direction. The second positioning projection 68 fits in a positioning groove (not shown) which is formed in a rear surface of the X-axis slide 44, and an engaging member (not shown) which is attached to the slide 44 engages the projection 68. In addition, an inclined surface 70 which is formed in a front end portion of a front one of the two first positioning projections 66 engages an inclined surface which is formed in the X-axis slide 44. Thus, the first member 54 is attached to the X-axis slide 44 such the first member 54 is not movable in the X-axis nor Y-axis direction and is pressed against an upper, horizontal feeder-support surface of the slide 44. Thus, the first member 54 is effectively prevented from jumping off the feeder-support surface of the slide 44.

Figure 3:
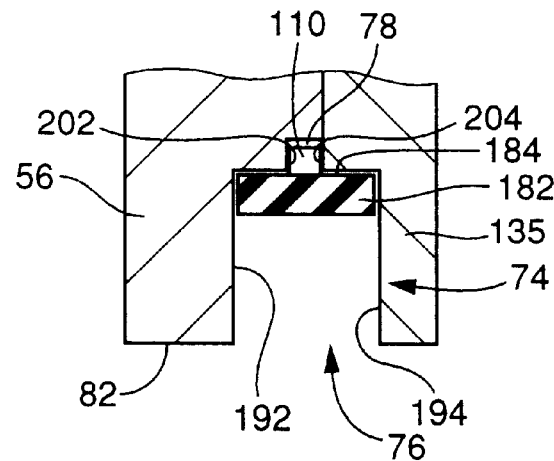
FIG. 3 is a cross-sectioned, side elevation view showing a guide groove formed in a second member as an element of a main body of the CC feeder, together with a CC-carry belt.
Figure 6:
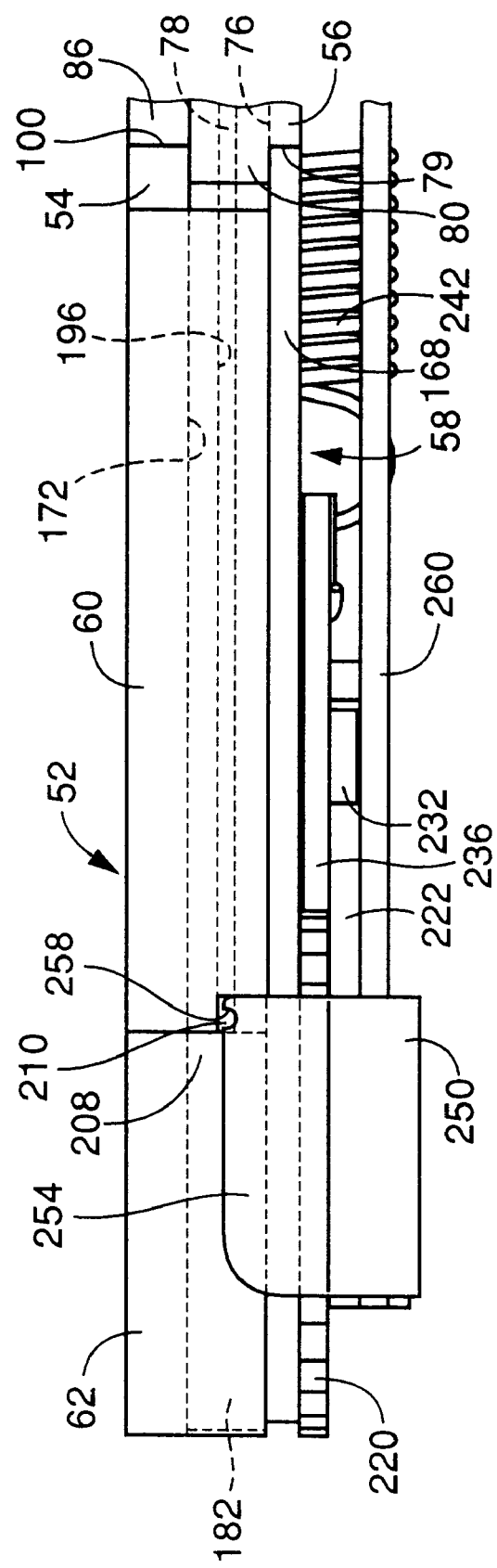
FIG. 6 is a plan view showing the CC-take-out portion of the CC feeder.

The second member 56 is assembled, for easier manufacturing thereof, from a plurality of sub-members. The second member 56 has a lower surface 82 which is angled at an intermediate position thereof as seen in the lengthwise direction of the first member 54. A guide groove 74 is formed through a front portion of the second member 56 in front of the angled position, such that the guide groove 74 extends in the lengthwise direction and opens in a front portion of the lower surface 82. As shown in FIG. 3, the guide groove 74 has a stepped cross section including a wide portion 76 on the side of the lower surface 82 and a narrow portion 78 opening in the wide portion 76 and having a width smaller than that of the same 76. As shown in FIGS. 5 and 6, the second member 56 has a front end surface 79 from an upper portion of which an engagement tongue 80 having a small width projects frontward. The tongue 80 has a thickness suitable for forming the narrow portion 78 therethrough, and the narrow portion 78 is formed through the tongue 80 and opens in a front end surface of the same 80.

As shown in FIG. 2, the first member 54 has a recess 86 in an intermediate portion thereof as seen in the lengthwise direction thereof. The recess 86 is formed through the first member 54 in the widthwise direction thereof and opens in the upper surface thereof. In rear of the recess 86, the first member 54 has an attachment portion 94 which is inclined relative to the upper surface thereof in front of the recess 86, by the same angle as that at which a rear portion of the lower surface 82 of the second member 56 is angled or inclined relative to a front portion of the lower surface 82. An upper surface of the attachment portion 94 is inclined rearward and upward. The second member 56 is positioned relative to the first member 54, and is fixed to the first member 54 by a fixing device (not shown). The positioning and fixing of the second member 56 will be described later.

Figure 9:
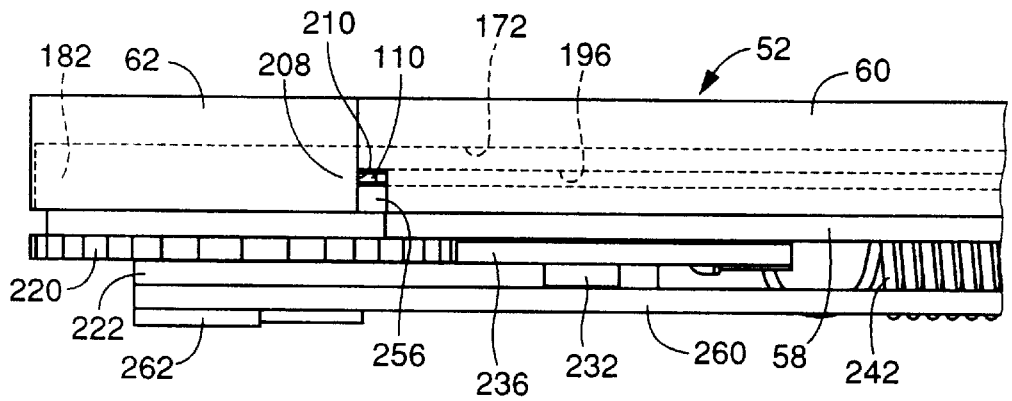
FIG. 9 is a plan view of the CC-take-out portion of the CC feeder with a movable cover being removed.

As shown in FIG. 2, a CC-store case 112 is detachably attached to a rear end portion of the second member 56. The CC-store case 112 stores a number of CCs 110 in bulk in the form of chips each having no lead wires (FIG. 9). The CCs 110 stored in the CC-store case 112 enter a CC-store room 114 via an opening formed through a rear wall of the second member 56, and then enter a first and a second CC-stir room 116, 118. Those three rooms 114, 116, 118 are parallel to a rear portion of the second member 56 in rear of the intermediate position where the lower surface 82 is angled. Therefore, respective bottom surfaces of the three rooms 114, 116, 118 are inclined rearward and upward. That is, an upstream portion of the bottom surface of each room 114, 116, 118 as seen in the CC feeding direction is higher than a downstream portion of the same.

The first CC-stir room 116 is smaller than the CC-store room 114, and the two rooms 114, 116 are partitioned by a first partition member 124. A lower end portion of the partition member 124 cooperates with the bottom surface of the CC-store room 114 to define an outlet 126 of the room 114 which permits several CCs 110 to simultaneously pass therethrough. Therefore, the CCs stored in the CC-store room 114 naturally move, by their weights, little by little into the first CC-stir room 116.

Figure 4:
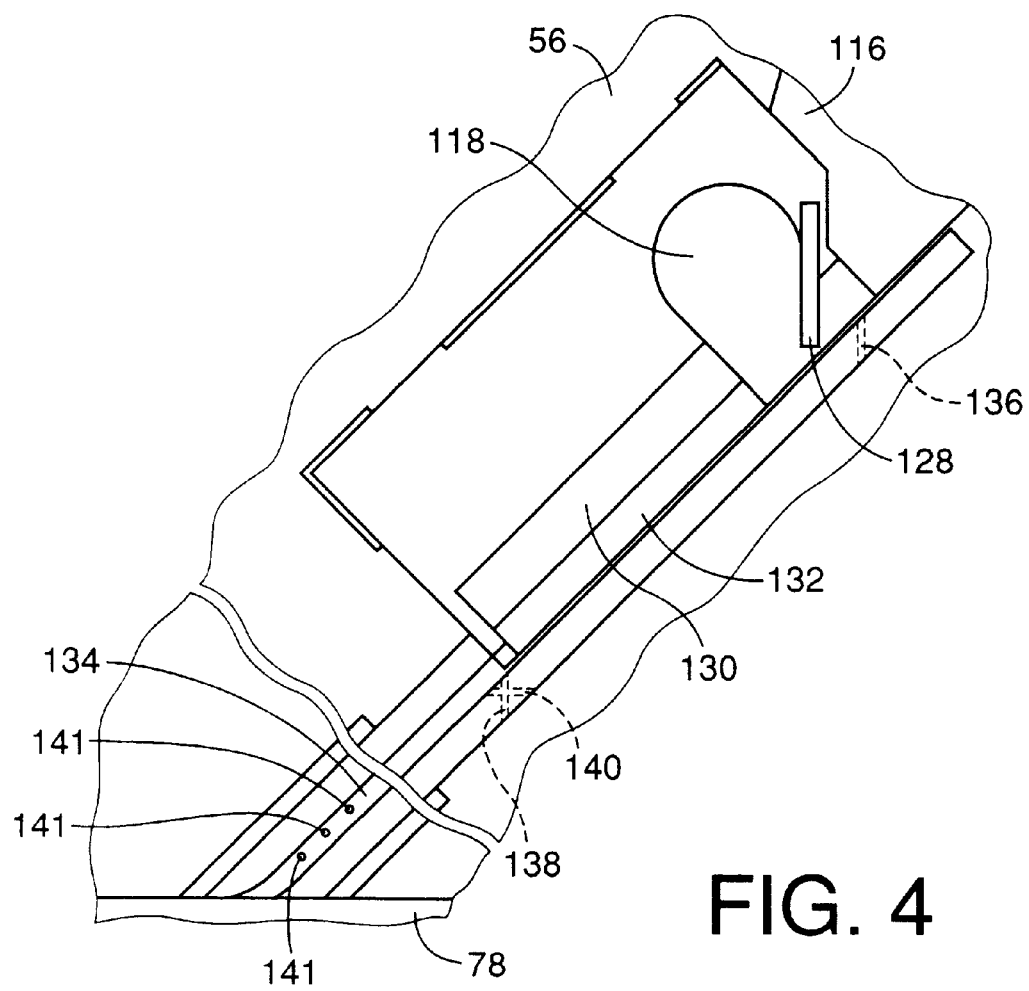
FIG. 4 is a front elevation view showing a CC stirring device of an air-using CC line-up device as an element of the CC feeder, together with a CC-supply passage.

As shown in FIG. 4, the second CC-stir room 118 and the first CC-stir room 116 are partitioned by a second partition member 128. The CCs 110 present in the first CC-stir room 116 move into the second CC-stir room 118, via a recess (not shown) formed through the second partition member 128, while being somewhat disciplined. A bar-like movable member 130 is provided in a front portion of the second CC-stir room 118 which is remote from the first CC-stir room 116, such that the bar member 130 extends parallel to the bottom surface of the second CC-stir room 118 and is movable in a direction perpendicular to the bottom surface. Thus, the second CC-stir room 118 has, under the movable member 130, a line-up passage 132 whose dimension as measured in the direction perpendicular to the bottom surface is changeable between a lower limit at which the passage 132 permits the passage therethrough of a single CC 110 only and an upper limit at which the passage 132 permits the simultaneous passage therethrough of several CCs 110.

The second member 56 has a supply passage 134 which opens in the line-up passage 132 and the narrow portion 78 of the guide groove 74. The supply passage 134 is parallel to the CC-store room 114 and the first and second CC-stir rooms 116, 118, and is inclined relative to the guide groove 74. The opening of the supply passage 134 in the line-up passage 132 is an inlet of the passage 134, and the opening of the passage 134 in the guide groove 74 is an outlet of the passage 134.

The guide groove 74, the supply passage 134, the CC-store room 114, and the first and second CC-stir rooms 116, 118 are defined by the cooperation of the second member 56 and a cover member 135 (FIG. 3). FIG. 2 shows the second member 56 with the cover member 135 being removed.

As shown in FIG. 4, the second member 56 has, at a position between the second partition member 128 and the first CC-stir room 116, a first CC-stir air-blow hole 136 having a directional component toward the first CC-stir room 116. In addition, the second member 56 has, at a position near the inlet of the supply passage 134, a second CC-stir air-blow hole 138 having a directional component toward the line-up passage 132 and accordingly the second CC-stir room 118. Moreover, the second member 56 has, at a position near the inlet of the supply passage 134, a CC-feed air-blow hole 138 having a directional component toward the outlet of the supply passage 134. Furthermore, the second member 56 has a plurality of air-relieve holes 141 (FIG. 4) which are close to each other and whose one ends open around the outlet of the supply passage 134 and whose other ends open in an outer surface of the second member 56. Thus, the first and second CC-stir rooms 116, 118 and the second CC-stir air-blow hole 138 cooperate with one another to provide a CC stirring device, which cooperates with the CC-store room 114, the supply passage 134, and the CC-feed air-blow hole 140 to provide an air-using CC line-up device as a sort of CC line-up device.

The second member 56 has a common air-supply passage (not shown) formed therein which communicates with each of the above-indicated three air-blow holes 136, 138, 140. With the second member 56 being attached to the first member 54, the common air-supply passage communicates with an air-supply passage 142 (FIG. 2) formed in the first member 54. The air-supply passage 142 is connected to a joint 148 attached to a bracket 146 fixed to the first member 54, via a communication passage including a hose 144. The hose 144 is accommodated in a hose accommodating groove (not shown) as a hose accommodating portion of the first member 54, so that the hose 144 does not protrude over the side surface of the CC feeder 12. As shown in FIG. 6, a width of a front end portion of the second member 56 is smaller than the sum of a width of the first member 54 and a width of the third member 58 fixed to the first member 54, by a width of a space provided on one side of the front end portion of the second member 56. The hose 144 runs upward through that space, so as to be connected to the joint 148.

As shown in FIG. 2, the joint 148 is connectable to another joint 158 provided at the CC supplying position. The joint 158 is connected to an air-supply device or source 160. A solenoid-operated direction-control valve 162 is provided between the joint 158 and the air-supply device 160, and is switched to selectively connect the joint 158 to the air-supply device 160 or the atmosphere.

The joint 158 is moved up and down by an elevating and lowering device 164 as a joint driving device. The joint 158 is moved downward to its operative position where the joint 158 is connected to the joint 148 of one CC feeder 12 whose CC-take-out portion is currently positioned at the CC supplying position, and is moved upward to its inoperative position away from the joint 148. If the joint 158 being connected to the joint 148 is communicated with the air-supply device 160, the first and second CC-stir air-blow holes 136, 138 and the CC-feed air-blow hole 140 simultaneously blow air.

Next, the third member 58 will be described. As shown in FIG. 7, the third member 58 is fixed to the first member 54. As shown in FIGS. 5 and 7, the third member 58 includes a plate-like attachment portion 166 to which a positioning pawl 236 (described later) is attached; and a guide portion 168 which is provided above the attachment portion 166 such that the guide portion 168 extends parallel to the lengthwise direction of the first member 54 (i.e., the CC feeding direction) and which has a width greater than that of the attachment portion 166. The guide portion 168 has a length starting at a position adjacent to an upstream-side end of the CC-take-out portion as seen in the CC feeding direction where the CCs 110 are picked up, to an end surface 100 defining a front end of the recess 86 formed in the first member 54. The guide portion 168 has a recess 170 (FIG. 7) which is formed therethrough in the CC feeding direction and which opens upward and leftward as seen in FIG. 7. The recess 170 has a rectangular cross section. The leftward opening of the recess 170 is closed by the first member 54, to provide a guide groove 172 which has a rectangular cross section and which has the same width as that of the wide portion 76 of the guide groove 74 formed in the second member 56. As shown in FIG. 8, a portion of the guide portion 168 which provides a side wall defining the guide groove 172 projects upward over an upper surface of the first member 54.

As shown in FIG. 8, the upper opening of the guide groove 172 is closed by the fourth member 60 fixed to the first member 54. The fourth member 60 provides a fixed cover member. As shown in FIG. 6, the fourth member 60 has a length starting at a position corresponding to the CC-take-out portion and ending at a position near the recess 86 formed in the first member 54, and covers a portion of a CC-carry belt 182 which corresponds to the CC-take-out portion. The fourth member 60 has a guide groove 196 which has a rectangular cross section, which has the same width and depth as those of the narrow portion 78 of the guide groove 74, which opens in a lower surface of the fourth member 60, and which is formed through the fourth member 60 in the CC feeding direction. The fourth member 60 is fixed to the first member 54, such that the fourth member 60 is held in abutment with the projecting portion of the guide portion 168 of the third member 58 which projects upward over the upper surface of the first member 54 and is thereby positioned in the direction of width thereof. Thus, the projecting portion of the guide portion 168 provides a positioning member which positions the fourth member 60 in the direction of width thereof. As shown in FIG. 8, the guide groove 196 is aligned with a widthwise center of the guide groove 172.

When the second member 56 is attached to the first member 54, first, the rear portion of the second member 56 corresponding to the half portion of the lower surface 82 in rear of the intermediate, angled position, is supported by the attachment portion 94 of the first member 54, as shown in FIG. 2. Thus, the second member 56 is positioned relative to the first member 54 in a direction perpendicular to the inclined upper surface of the attachment portion 94. Second, the rear portion of the second member 56 is positioned relative to the first member 54 in the direction of width thereof with the help of a positioning member (not shown). Then, as shown in FIGS. 5 and 6, the front end portion of the second member 56 is positioned in the direction of width thereof by holding one side surface of the engagement tongue 80 in abutment with the projecting portion of the guide portion 168 which defines the guide groove 172 and which projects upward over the upper surface of the first member 54. Finally, the second member 56 is fixed to the first member 54 with a fixing device (not shown), such that the front end surface of the tongue 80 is held in abutment with the fourth member 60 fixed to the first member 54.

In the state in which the second member 56 is fixed to the first member 54, the guide groove 74 extends in a horizontal direction parallel to the lengthwise direction of the first member 54, and the rear portion of the second member 56 corresponding to the rear portion of the lower surface 82 in rear of the intermediate, angled position is inclined rearward and upward. In addition, there is left a small space between the front end surface 79 of the second member 56, from which the engagement tongue 80 projects frontward, and the guide portion 168 of the third member 58. The dimensional tolerances prescribed for the CC feeder 12 assures that the front end surface and one side surface of the tongue 80 are held in contact with the fourth member 60 and the guide portion 168, respectively, and that the front surface 79 of the second member 56 is slightly spaced from the guide portion 168. Since, however, the space left between the front surface 79 of the second member 56 and the guide portion 168 is too small to draw on the drawing sheets, FIGS. 5 and 6 show the front surface 79 of the second member 56 held in contact with the guide portion 168 as if there were no space therebetween. The guide groove 172 is accurately aligned with the wide portion 76 of the guide groove 74 and cooperates with the wide portion 76 to provide a straight continuous belt-guide groove which extends parallel to the CC feeding direction; and the guide groove 196 is accurately aligned with the narrow portion 78 of the guide groove 74 and cooperates with the narrow portion 78 to provide a straight CC-guide groove which extends parallel to the CC feeding direction and which is continuous without any gaps in that direction. Thus, the guide portion 168 of the third member 58, and the fourth member 60 cooperate with each other to also function as a positioning device which positions the second member 56. As described above, the front end portion of the second member 56 is partly cut away to provide a space in which the hose 144 runs. Accordingly, the wide portion 76 opens in one side surface of the front end portion of the second member 56. However, since the remaining portion of the second member 56 in rear of the hose 144 has, as shown in FIG. 3, the same width as the sum of the respective widths of the first member 54 and the guide portion 168 of the third member 58, the remaining portion of the wide portion 76 is defined by a pair of side walls 192 and 194. Thus, the CC-carry belt 182 can be guided through the wide portion 76 without any problems.

As shown in FIG. 2, a drive pulley 174 and a driven pulley 176 are attached to a front portion and a rear portion of the first member 54 via respective axis members 178, 180 such that the drive and driven pulleys 174, 176 are rotatable about respective axis lines parallel to the direction of width of the first member 54. The two pulleys 174, 176 are timing pulleys, and the timing belt 182 as a sort of belt is wound on the pulleys 174, 176. The belt 182 has an endless, annular shape, and a length of the belt 182 fits in the guide groove 172 and the wide portion 76 of the guide groove 74. An outer (i.e., upper) surface of an upper half portion of the belt 182 provides a CC-carry surface 184 which carries the CCs 110. As shown in FIGS. 3 and 8, opposite side surfaces of the upper half portion of the belt 182 are guided by side walls 188, 190 defining the guide groove 172, and side walls 192, 194 defining the wide portion 76 of the guide groove 74. An inner (i.e., lower) surface of the upper half portion of the belt 182, opposite to the CC-carry surface 184, is supported on a bottom wall 186 defining the guide groove 172. Thus, the side walls 188, 190, 192, 194 cooperate with one another to provide guide surfaces which guide the belt 182; and the bottom wall 186 provides a bottom surface which supports the belt 182. In addition, opposite side surfaces of each of the CCs 110 lined up on the CC-carry surface 184 are guided by side walls 198, 200 defining the guide groove 196, and side walls 202, 204 defining the narrow portion 78 of the guide groove 74. Thus, the side walls 198, 200, 202, 204 cooperate with one another to provide guide surfaces which guide the CCs 110. Since the narrow portion 78 opens downward, a portion of the second member 56 (including the engagement tongue 80) which defines the narrow portion 78 also functions as a cover member which covers the CCs 110 and thereby prevents the jumping of each CC 110 out of the narrow portion 78.

Figure 10:
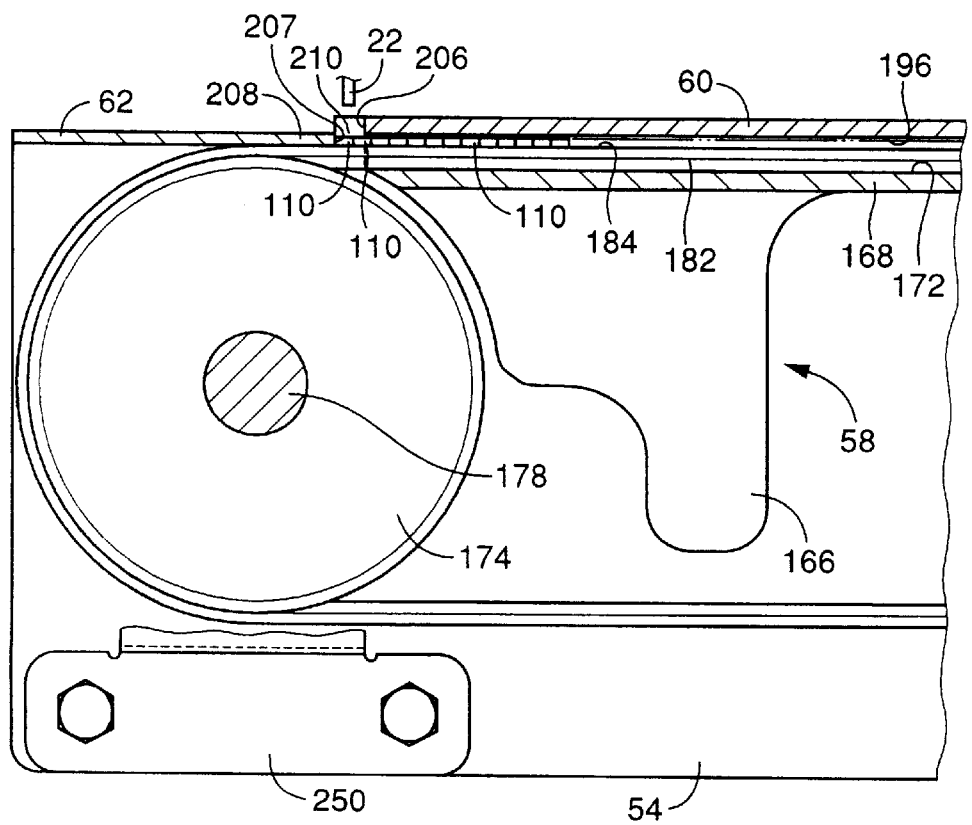
FIG. 10 is a partly cross-sectioned, front elevation view showing the CC-take-out portion of the CC feeder with a ratchet wheel being removed.

As shown in FIGS. 9 and 10, a portion of the fourth member 60 which defines a front end portion of the guide groove 196 and which corresponds to the CC-take-out portion has a recess 206 which opens in a front end surface of the fourth member 60 and which is formed through a thickness of the same 60. The recess 206 has a width (i.e., a dimension in a direction perpendicular to the CC feeding direction and a vertical direction) which is slightly greater than that of each CC 110, and has a dimension in the CC feeding direction which is slightly smaller than 1.5 times the dimension of each CC 110 in that direction. Thus, just one CC 110 can be taken out through the recess 206. In FIG. 9, a ratchet wheel 220, a first pivotable member 222, etc. are not shown for easier understanding purposes only.

The fifth member 62 is fixed to a portion of the upper surface of the first member 54 which is located on a downstream side of the CC-take-out portion in the CC feeding direction. A lower surface of the fifth member 62 is flush with a lower surface of the fourth member 60 in a horizontal plane. The fifth member 62 is held in contact with a front end surface of the fourth member 60, such that the fifth member 62 closes a lower portion of an opening of the recess 206 in the front surface of the fourth member 60 and such that the fifth member 62 is opposed to an outlet of the guide groove 196. Therefore, each CC 110 which is moved from the guide groove 196 into the recess 206 by the movement of the CC-carry surface 184 strikes against a stopper surface 207 (FIGS. 5 and 10) of the fifth member 62 which is perpendicular to the CC feeding direction and the CC-carry surface 184. Thus, each CC 110 is stopped. A portion of the fifth member 62 which has the stopper surface 207 provides a stopper 208; and the belt 182 and the stopper 208 cooperate with a portion of the fourth member 60 which defines the recess 206 to define a CC-take-out space 210 in the CC-take-out portion of the CC feeder 12.

As shown in FIG. 7, the ratchet wheel 220 is integral, and concentric, with the drive pulley 174, and fits on the axis member 178 such that the ratchet wheel 220 is rotatable with the drive pulley 174 about the axis member 178. A first pivotable member 222 additionally fits on the axis member 178 such that the first pivotable member 222 is pivotable about the axis member 178. The first pivotable member 222 is pivotable relative to the ratchet wheel 220 about an axis line about which the ratchet wheel 220 is rotatable.

As shown in FIG. 5, a driving pawl 224 is attached with a pin 226 to the first pivotable member 222, such that the driving pawl 224 is pivotable about an axis line parallel to the axis line of rotation of the ratchet wheel 220 and such that the driving pawl 224 is engaged with teeth 228 of the wheel 220. When the first pivotable member 222 is pivoted in its forward direction, i.e., counterclockwise in FIG. 5, the driving pawl 224 does not move over any teeth 228 of the ratchet wheel 220, i.e., does not move relative to the wheel 220; and when the first pivotable member 222 is pivoted in its backward direction, i.e., clockwise in FIG. 5, the driving pawl 224 moves over the teeth 228 of the wheel 220, i.e., moves relative to the wheel 220. The driving pawl 224 is biased in a direction to engage the teeth 228 of the ratchet wheel 220, by a first spring member 230 as a sort of elastic member as a sort of biasing device. The rotation of the ratchet wheel 220 in its forward direction is stopped by striking of the driving pawl 224 against a stopper 232 fixed to the attachment portion 166 of the third member 58. Simultaneously, the pivotal movement of the first pivotable member 222 in its forward direction is stopped.

A positioning pawl 236 is attached to the attachment portion 166 of the third member 58. More specifically described, a second pivotable member 238 is attached to the attachment portion 166 via an axis member 240 such that the second pivotable member 238 is pivotable about an axis line parallel to the axis line of rotation of the ratchet wheel 220. The positioning pawl 236 is provided by a free end portion of the second pivotable member 238. The second pivotable member 238 is biased in a direction in which the positioning pawl 236 engages the teeth 228 of the ratchet wheel 220, by a second spring member 242 as a sort of elastic member as a sort of biasing device.

Figure 11:
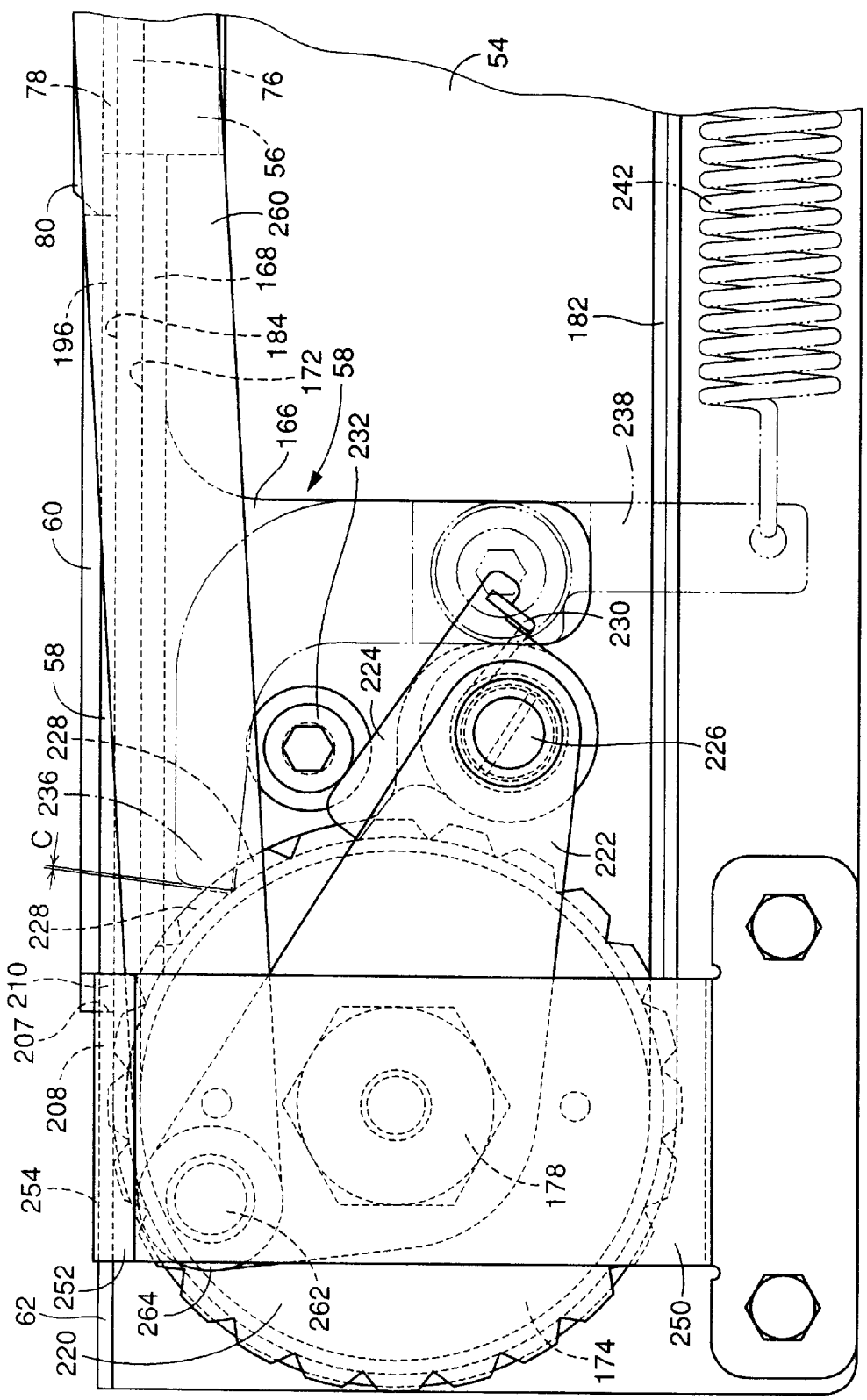
FIG. 11 is a view illustrating the manner in which a positioning pawl of a belt driving device as an element of the CC feeder is attached to the third member.

The positioning pawl 236 engages the teeth 228 of the ratchet wheel 220, such that the pawl 236 permits the ratchet wheel 220 to be rotated in its forward direction but does not permit the wheel 220 to be rotated in its backward direction. With the driving pawl 224 being pivoted away from the stopper 232, the positioning pawl 236 engages two successive or adjacent teeth of the teeth 228 of the ratchet wheel 220, thereby positioning the wheel 220. The positioning pawl 236 is attached to the attachment portion 166, at a position where the pawl 236 engages two adjacent teeth of the teeth 228 of the ratchet wheel 220, thereby stopping the rotation of the wheel 220, when the wheel 220 has been rotated by a small angle in its backward direction after being rotated in its forward direction and stopped by the striking of the driving pawl 224 against the stopper 232. That is, as shown in FIG. 11, when the rotation of the ratchet wheel 220 in its forward direction is stopped, a small space, C, remains between the positioning pawl 236, indicated in two-dot chain lines, and an upstream one of two adjacent teeth 228 as seen in the backward direction of the wheel 220, and the positioning pawl 236 engages the other, 15 downstream tooth 228. Thus, the positioning pawl 236 is pivoted clockwise by a small angle as seen in FIG. 11, in a direction away from the teeth 228, against the biasing force of the second spring 242. Therefore, if the driving pawl 224 is pivoted in the direction away from the stopper 232 as described above, the positioning pawl 236 rotates, owing to the biasing force of the second spring 242, the ratchet wheel 220 in its backward direction by a small angle corresponding to the small space C.

When the first pivotable member 222 is pivoted in its forward direction, the driving pawl 224 is pivoted in its forward direction about the axis line of pivotal movement of the first pivotable member 222, while the driving pawl 224 remains engaged with the teeth 228 of the ratchet wheel 220. Thus, the ratchet wheel 220 is rotated in its forward direction and accordingly the drive pulley 174 is rotated. The CC-carry belt 182 is circulated in its forward direction and accordingly the CC-carry surface 184 is moved in its forward direction. The CCs 110 are moved toward the stopper 208. The amount of one-time movement of the CC-carry surface 184 in its forward direction is greater than the dimension of each CC 110 in a direction parallel to the CC feeding direction. As shown in FIGS. 9 and 10, the leading one of the CCs 110 assuredly strikes against the stopper 208. In addition, even if a space may be left between the leading CC 110 and the second CC 110, between the second and third CCs 110, and so on, the space or spaces is or are decreased and even eliminated. An excess of the movement of the CC-carry surface 184 relative to the stopper 208 is allowed by sliding of the CCs 110 on the surface 184. While the ratchet wheel 220 is rotated in its forward direction as described above, the teeth 228 of the wheel 220 push back the positioning pawl 236 against the biasing force of the second spring member 242, so that the pawl 236 moves over the teeth 228. This is achieved by the respective shapes of the teeth 228, the driving pawl 236, and the positioning pawl 236, the respective relative positions of the teeth-engaging portions of the pawls 224, 236 relative to the respective centers of pivotal movement of the pawls 224, 236, and the respective biasing forces of the first and second spring members 230, 242.

Figure 12:
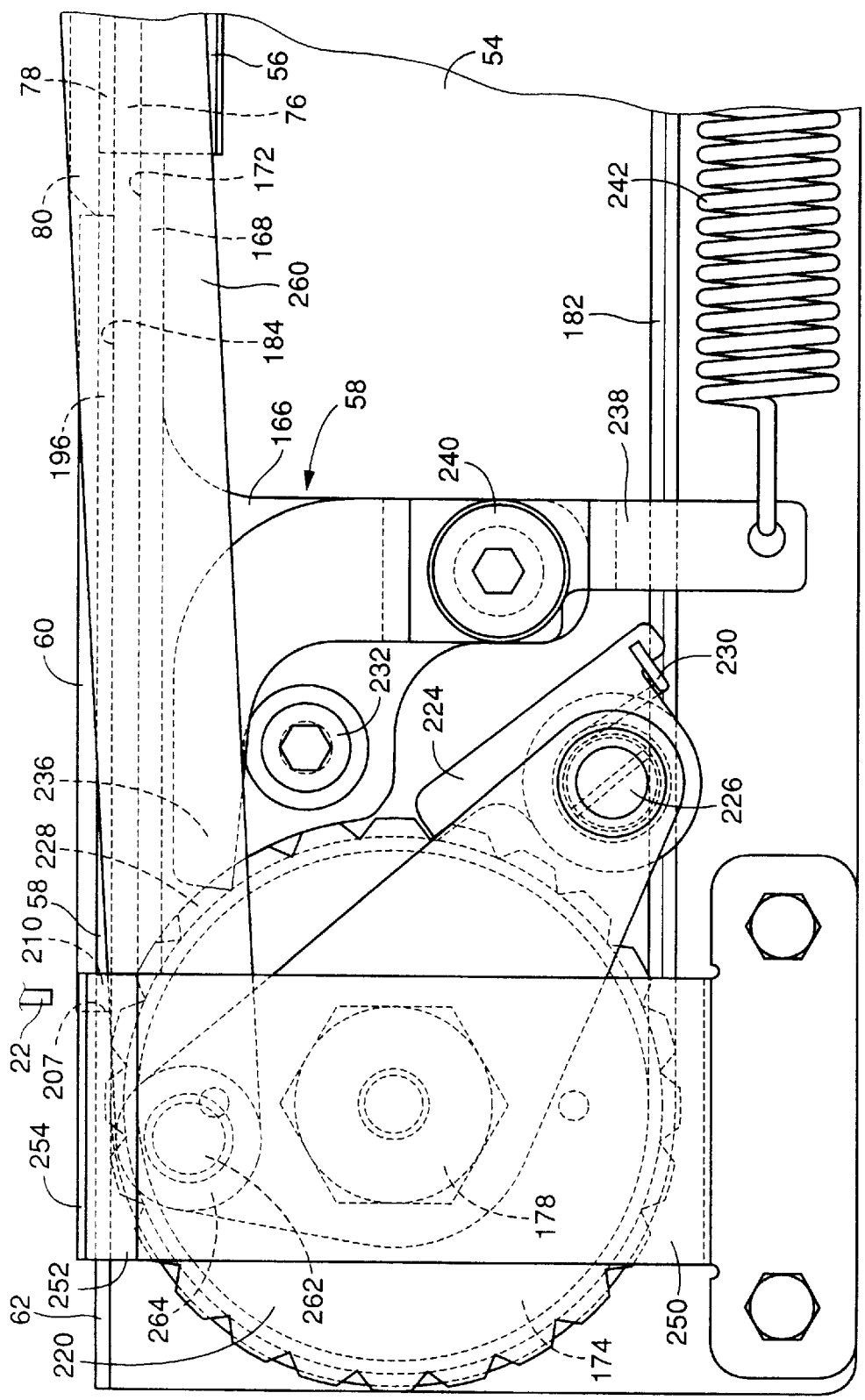
FIG. 12 is a front elevation view showing the state in which a first pivotable member as an element of the belt driving device has been pivoted backward.
Figure 13:
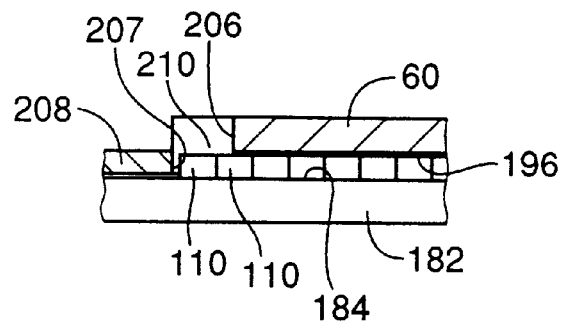
FIG. 13 is a partly cross-sectioned, front elevation view showing the state in which a leading one of a plurality of CCs lined up on the CC-carry belt in the CC feeder has been moved away from a stopper.

In the state in which the first pivotable member 222 has been rotated in its forward direction till the driving pawl 224 strikes against the stopper 232 and the rotation of the ratchet wheel 220 in its forward direction has been stopped, the positioning pawl 236 is held at a position where the pawl 236 is pushed back a small angle by one tooth 228, away from its wheel-positioning position, against the biasing force of the second spring 242. Then, if the first pivotable member 222 is rotated in its backward direction, the driving pawl 224 is pivoted in its backward direction about the axis line of pivotal movement of the first pivotable member 222, and accordingly the ratchet wheel 220 is released from the engagement with the pawl 224, the positioning pawl 236 is pivoted toward its wheel-positioning position by the biasing force of the second spring 242. Thus, the positioning pawl 236 rotates the ratchet wheel 220 by the small angle until the pawl 236 engages two adjacent teeth 228 of the wheel 220. Consequently the CC-carry surface 184 is moved back a small distance, as shown in FIG. 13. That is, the leading CC 110 is moved slightly away from the stopper 208. As the first pivotable member 222 is pivoted in its backward direction, the driving pawl 224 is pivoted in its backward direction while moving over the teeth 228, as shown in FIG. 12. This is a preparation for the next forward movement of the CC-carry surface 184. During the backward movement of the driving pawl 224, the positioning pawl 236 is held at its wheel-positioning position while preventing the ratchet wheel 220 from being moved in its backward direction. This is achieved by the respective shapes of the teeth 228, the driving pawl 236, and the positioning pawl 236, the respective relative positions of the teeth-engaging portions of the pawls 224, 236 relative to the respective centers of pivotal movement of the pawls 224, 236, and the respective biasing forces of the first and second spring members 230, 242.

As shown in FIGS. 5 and 7, a movable cover member 250 is attached to the first member 54. The cover member 250 is movable to cover and open the CC-take-out space 210. The cover member 250 is formed of a leaf spring. One lengthwise end portion of the cover member 250 is fixed to a lower end portion of one side surface of the first member 54, such that an intermediate portion of the cover member 250 extends vertically outside the first pivotable member 222. An upper end portion of the cover member 250 includes an inclined portion 252 which is inclined toward the first pivotable member 222. A top portion of the cover member 250 extends over the CC-take-out space 210 and the stopper 208 to provide a closing portion 254 which closes the CC-take-out space 210. As shown in FIG. 6, the closing portion 254 covers a portion of the CC-carry surface 184 which is adjacent to the stopper 208.

As shown in FIG. 9, the fourth member 60 has a recessed portion 256 which is formed by removing an upper portion of a space-defining portion thereof which defines the CC-take-out space 210. An upper surface of the recessed portion 256 is flush with that of the stopper 208. As shown in FIG. 6, the closing portion 254 of the movable cover member 250, in its closed state in which the closing portion 254 closes the CC-take-out space 210, covers the stopper 208 and the fourth member 60 such that no clearance is left between a lower surface of the closing portion 254 and the upper surfaces of the stopper 208 and the recessed portion 256. As shown in FIG. 10, the fifth member 62 or the stopper 208 is thinner than the fourth member 60. Therefore, in the state in which the closing portion 254 closes the CC-take-out space 210, the depth of the space 210 is just slightly greater than the height (i.e., thickness) of each CC 110. Thus, the closing portion 254 effectively prevents the leading CC 110 from jumping up, or lying on its side. As shown in FIG. 6, the closing portion 254 has a semi-circular recess 258 which is formed through the thickness of a portion thereof which is positioned right above the CC-take-out space 210. Through the semi-circular recess 258, the operator can see whether any CCs 140 are present in the space 210, at an appropriate time such as when the CC supplying operation is not being carried out.

As shown in FIGS. 2 and 5, one end portion of a drive lever 260 is attached using a pin 262 to the first movable member 222 such that the drive lever 260 is pivotable about an axis line parallel to the axis line of pivotal movement of the first movable member 222. The pin 262 has a stepped shape including a head portion 264. As shown in FIG. 7, the head portion 264 and the drive lever 260 are located between the first movable member 222 and the movable cover member 250. The head portion 264 is rounded off.

As shown in FIG. 2, the other end portion of the drive lever 260 extends rearward from the first pivotable member 222, and is attached using a pin 266 to a first link 268. The first link 268 is attached to the first member 54 via an axis member 270 such that the first link 268 is pivotable about the axis member 270. The drive lever 260 is attached to one arm portion 272 of the first link 268 such that the drive lever 260 is pivotable about the pin 266, and a lower end portion of an elevator link 276 is connected to the other arm portion 274 of the first link 268 via a pin 278 such that the link 276 is pivotable about the pin 278. One end portion of a second link 280 is attached to an upper end portion of the elevator link 276 via a pin 282 such that the second link 280 is pivotable about the pin 282.

The other end portion of the second link 280 is attached to the previously-described bracket 146 via an axis member 284. The respective axis lines of pivotal movement of the drive lever 260, the first and second links 268, 280, and the elevator link 276 are parallel to that of the first pivotable member 222. The distance between the pin 282 and the axis member 284 is equal to that between the pin 278 and the axis member 270, and the distance between the two pins 278, 282 is equal to that between the two axis members 270, 284. Thus, when the first and second links 268, 280 are pivoted, the elevator link 276 is moved substantially vertically upward and downward.

A tension coil spring 286 (hereinafter, referred to as the "tension spring" 286) as a sort of elastic member as a sort of biasing device is provided between the first member 54 and the arm portion 272 of the first link 268. The tension spring 286 biases the first link 268 in a direction in which the elevator link 276 is moved upward. The pivotal movement of the first link 268 by the biasing force of the tension spring 286 is stopped by striking of the driving pawl 224 against the stopper 232. The elevator link 276 has, in an upper end portion thereof, an engageable portion 288 which is engageable with a roller 296 of an elevator member 294. In the present embodiment, the driving pawl 224, the first pivotable member 222, the drive lever 260, the first and second links 268, 280, the elevator link 276, and others cooperate with one another to provide a drive mechanism, which cooperates with the drive pulley 174, the ratchet wheel 220, and the positioning pawl 236 to provide a belt driving device 290.

The elevator member 294 is provided at the CC supplying position, i.e., right above the elevator link 276 of the CC feeder 12 whose CC-take-out portion is currently positioned at the same position. The rotation of the index-table servomotor 26 is converted and transmitted to the elevator member 294 by a motion converting device (not shown) provided by a cam, a cam follower, etc., so that the elevator member 294 is moved up and down in synchronism with the taking-out of the CC 150 by each CC sucking head 22. The roller 296 attached to the lower end portion of the member 294 is rotatable about an axis line parallel to the Y-axis direction. Since the elevator member 294 engages the engageable portion 288 of the elevator link 276 via the roller 296, only a small frictional resistance is produced between the member 294 and the link 276.

The present CC mounting system 8 includes a control device 300, shown in FIG. 2, which is essentially provided by a computer. The control device 300 controls the index-table servomotor 26, the X-axis servomotor 50, the solenoid valve 162, the elevating and lowering device 164, etc.

Next, the operation of the CC mounting system 8 constructed as described above will be described below.

When the CCs 110 are mounted on the PCB 18, the X-axis slide 44 is moved in the X-axis direction so that the respective CC-take-out portions of the CC feeders 12 are sequentially positioned at the CC supplying position. After each CC feeder 12 is positioned, each CC sucking head 22 is lowered and elevated for taking out one CC 110 through the CC-take-out space 210. When the CC-take-out portion of each CC feeder 12 is position at the CC supplying positioned, the joint member 158 is lowered and connected to the joint member 148.

In the state in which each CC feeder 12 waits for one CC sucking head 22 to take out one CC 110 therefrom, the leading CC 110 has been located in the CC-take-out space 210 of the CC-take-out portion of the feeder 12 and has been held in pressed contact with the stopper 208. In addition, as shown in FIG. 7, the movable cover member 250 is held in its closed state in which the closing portion 254 thereof closes the CC-take-out space 210. When the CC sucking head 22 is lowered for taking out one CC 110 through the CC-take-out space 210, the elevator member 294 is concurrently lowered so that the member 294 engages the engageable portion 288 of the elevator link 276 and thereby lowers the link 276.

Figure 14:
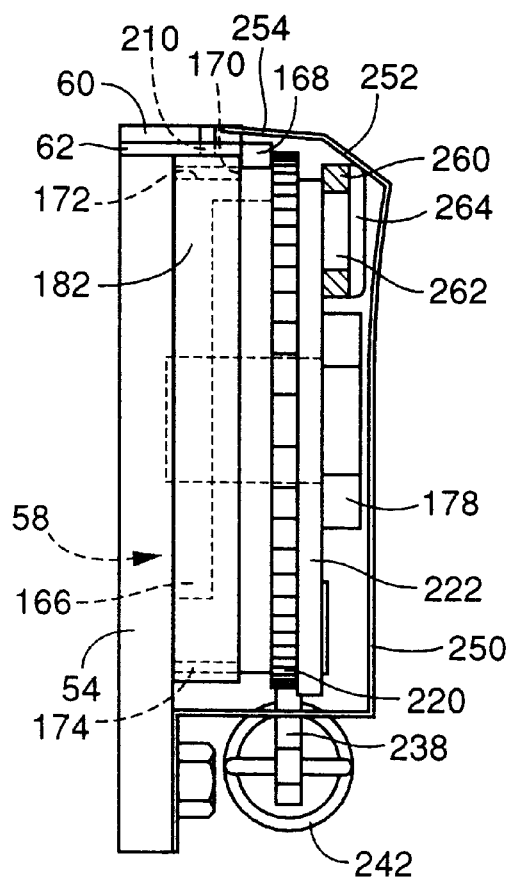
FIG. 14 is a partly cross-sectioned, side elevation view showing the state in which a movable cover member of the CC f eeder has been moved to its opened position.

The downward movement of the elevator link 276 causes the first link 268 to be pivoted against the biasing force of the tension spring 286, so that the drive lever 260 is moved rearward, i.e., upstream in the CC feeding direction. Thus, the first pivotable member 222 is pivoted in its backward direction so that, as shown in FIG. 12, the driving pawl 224 is pivoted in its backward direction while moving over the teeth 228 of the ratchet wheel 220. This is a preparation for a one-time movement of the CC-carry surface 184. The limit of the backward pivotal movement of the first pivotable member 222 is defined by a lowermost position taken by the elevator member 294. Once the first pivotable member 222 is pivoted backward and the ratchet wheel 220 is released from the secure engagement with the driving pawl 224, the positioning pawl 236 rotates, owing to the biasing force of the second spring 242, the ratchet wheel 220 in its backward direction by a small angle, so that the pawl 236 engages two adjacent teeth 228 of the wheel 220. Thus, as shown in FIG. 13, the leading CC 110 carried on the timing belt 182 is positioned at a position away by a small distance from the stopper 208, via the ratchet wheel 220 and the drive pulley 174. When the drive lever 260 is moved rearward, a portion of the first pivotable member 222 to which the drive lever 260 is connected is moved up so that the head portion 264 of the pin 262 engages the inclined portion 252 of the movable cover member 250. Thus, as shown in FIG. 14, the cover member 250 is elastically deformed so that the closing portion 254 is moved to its retracted or opened position away from the CC-take-out space 210. Since the head portion 264 is rounded off as described, the head portion 264 smoothly slides on the inclined portion 252. Therefore, only a small friction is produced, and the inclined portion 252 is prevented from being damaged.

Each CC sucking head 22 is lowered while the leading CC 110 is moved away from the stopper 208 and the movable cover member 250 is moved to its opened position. The CC sucking head 22 contacts and sucks the leading CC 110 after the leading CC 110 is moved away from the stopper 208 and the closing portion 254 of the movable cover 250 is moved away from the CC-take-out space 210. The present CC mounting system 8 is designed such that at the time when the movable cover member 250 completes its movement to its opened position, a small distance is left between the CC sucking head 22 being lowered and the closing portion 254 of the movable cover 250. Thus, the sucking head 22 is prevented from being interfered with by the movable cover member 250.

After the CC sucking head 22 holds, by suction, the leading CC 110, the head 22 is elevated for taking out the CC 110 through the CC-take-out space 210. As described above, since the leading CC 110 is spaced from the stopper 208, the head 22 does not fail to take out the CC 110 through the CC-take-out space 210, and the CC 110 held by the head 22 does not have any position errors relative to the head 22. If the leading CC 110 would otherwise be sandwiched between the stopper 208 and the following CC 110 and accordingly is pressed against the stopper 208 by the following CC 110, the CC sucking head 22 might fail to suck or take out the CC 110 through the CC-take-out space 210, because of the frictional resistance produced between the leading CC 110 and each of the stopper 208 and the following CC 110. If the CC 110 which has been once held by the CC sucking head 22 falls off the head 22 and is caught again by the head 22, the CC 110 might have a positional error relative to the head 22. On the other hand, in the CC mounting system 8, or in each CC feeder 12, the leading CC 110 to be taken out by the head 22 is spaced from the stopper 208. Therefore, neither the stopper 208 nor the following CC 110 prevents the head 22 from taking out the leading CC 110 through the CC-take-out space 210. Thus, each CC sucking head 22 can reliably and accurately take out each CC 110 from each CC feeder 12.

The CC-take-out space 210 or the recess 206 has, in the CC feeding direction, a dimension which is slightly smaller than 1.5 times the dimension of each CC 110. Therefore, with the leading CC 110 being present in the space 210, slightly less than half the second CC 110 following to the leading CC 110 enters the space 210. However, more than half the second CC 110 is covered by the fourth member 60. Accordingly, when the leading CC 110 is taken out through the space 210, next the CC 110 is prevented from jumping up or lying on its side.

In addition, while each CC 110 is taken out, the ratchet wheel 220 is kept positioned by the positioning pawl 236. Thus, the CC-carry surface 184 is prevented from being erroneously moved, and each CC sucking head 22 is prevented from failing to catch or take out the CC 110.

After the CC sucking head 22 is moved up for taking out the CC 110 through the CC-take-out space 210, the elevator member 294 is moved up, and the first link 268 is pivoted by the biasing force of the tension spring 286, so that the elevator link 276 is moved up. Consequently the drive lever 260 is moved frontward, i.e., in the CC feeding direction. Thus, the first pivotable member 222 is pivoted in its forward direction, and the driving pawl 224 is pivoted in its forward direction while being engaged with the teeth 228 of the ratchet wheel 220, so that the ratchet wheel 220 is rotated in its forward direction. Consequently the CC-carry surface 184 of the belt 182 is moved in its forward direction, so that the following or second CC 110 enters the CC-take-out space 210 and is stopped by the stopper 208. The pivotal movement of the first pivotable member 222 in its forward direction leads to lowering the height of the end portion of the drive lever 260 attached to the first pivotable member 222. As a result, the movable cover member 250 returns, owing to its elasticity, to its operative or closed position where the closing portion :254 of the cover member 250 closes the CC-take-out space 210.

During a time period from a little time before one-time carrying of the CCs 110 is started to the time when the carrying is ended, after one CC 110 is taken out through the CC-take-out space 210, the joint member 158 is kept communicated with the air-supply device 160 owing to the switching of the solenoid valve 162, so that the first and second CC-stir air-blow holes 136, 138 and the CC-feed air-blow hole 140 blow air. When the first CC-stir air-blow hole 136 blows air, the CCs 110 stored in the first CC-stir room 116 are stirred and blown up in the room 116. When the CCs 110 fall after the stopping of air blowing from the hole 136, one or more CCs 110 enter the second CC-stir room 118 via the recess formed in the second partition member 128. One or more CCs 110 present in the second CC-stir room 118 enter the CC-stir passage 132 below the movable member 130 owing to the inclination of the bottom surface of the room 118.

When the second CC-stir air-blow hole 138 blows air, the CCs 110 and the movable member 130 in the first CC-stir room 116 are stirred and moved up in the room 118. In the case where some CCs 110 are stacked on other CCs 110, those CCs 110 are made flat and arranged into a single array of CCs 110. Thus, the single array of CCs 110 is fed from the second CC-stir room 118 to the CC-supply passage 134. The air blown from the second CC-stir air-blow hole 138 reaches a portion of the second CC-stir room 118 adjacent to the first CC-stir room 116, and stirs the CCs 110 present in that portion.

The air blown from the CC-feed air-blow hole 140 presses and feeds the CCs 110 present in the CC-supply passage 134, toward the outlet of the passage 134. Since the air-blow hole 140 has a directional component toward the outlet of the CC-supply passage 134 and the air-relieve holes 141 are provided near the outlet of the passage 134, an air flow toward the outlet of the passage 134 is produced, so that the CCs 110 are moved toward the outlet. Consequently one CC 110 present at the outlet is put on the CC-carry surface 184 of the belt 182. Since the CC-supply passage 134 in which the single array of CCs 110 is fed forward is communicated with the narrow portion 78 of the guide groove 74 formed in the second member 56, the CCs 110 in the single array is put one by one from the passage 134 onto the CC-carry surface 184, so that the CCs 110 are arranged close to one another on the CC-carry surface 184.

After one-time blowing of the air from the holes 136, 138, 140, the solenoid valve 162 is switched to communicate the joint member 158 with the atmosphere, so that the air blowing from those holes 136, 138, 140 is stopped. Thus, the following or second CC 110 is moved into the CC-take-out space 210 and is brought into pressed contact with the stopper 208 and, in this state, the CC feeder 12 waits for the second CC 110 to be supplied to the CC mounting device 14. In the case where one CC feeder 12 successively supplies two or more CCs 110 to the CC mounting device 14, the joint member 148 is kept connected to the joint member 158 and, after the following or second CC 110 is taken out, the CCs 110 are fed forward by the air blown from the holes 136, 138, 140 in synchronism with the carrying of the CCs 110 on the CC-carry surface 184.

After one CC feeder 12 ends the operation of supplying one or more CCs 110, the joint member 158 is moved up away from the joint member 148 of the one feeder 12, and the X-axis slide 44 is moved to position, at the CC supplying position, the CC-take-out portion of the next CC feeder 12 to supply one or more CCs 110 next.

Figure 15:
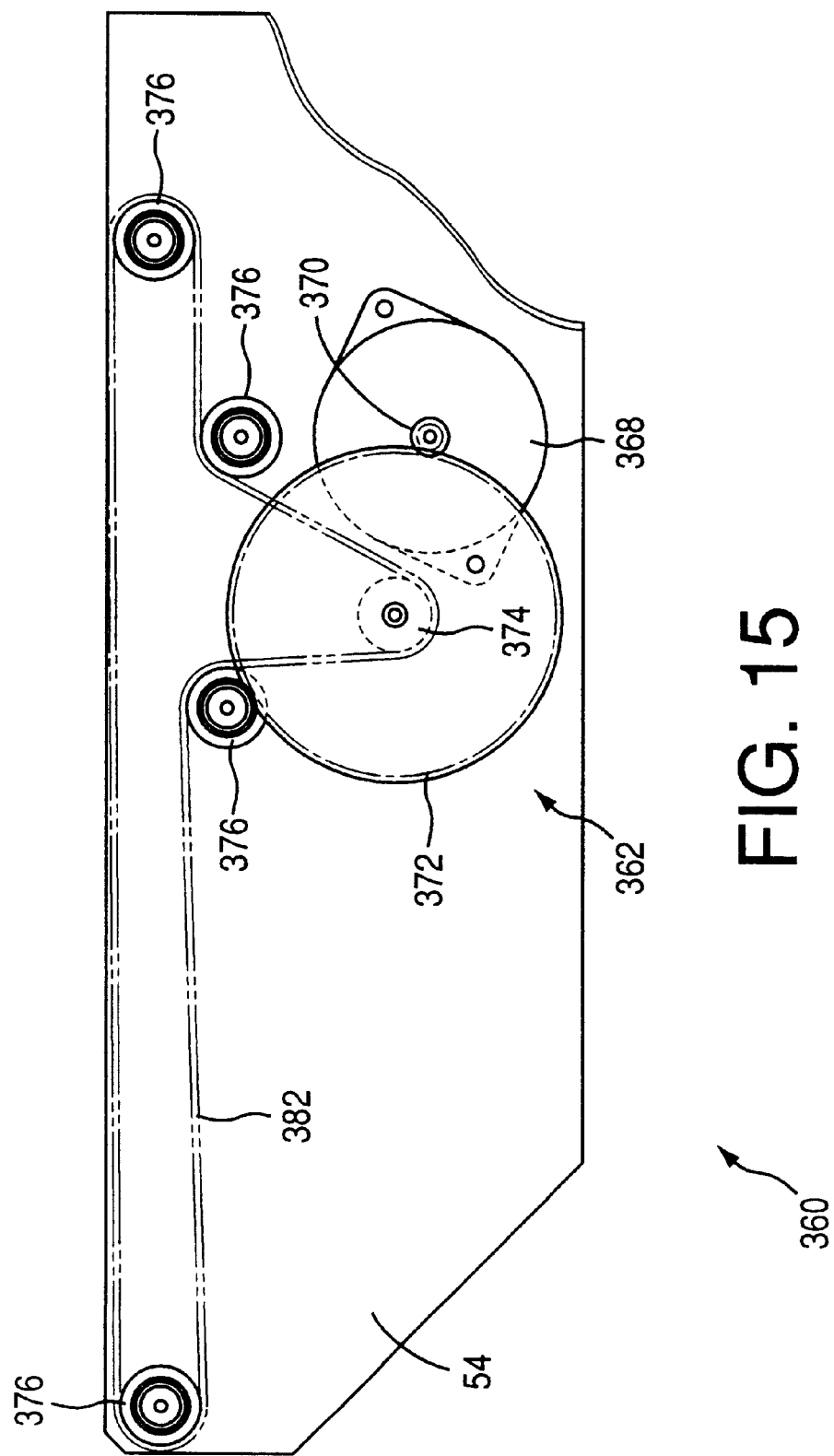
FIG. 15 is a front elevation view of a belt driving device of another CC feeder as a second embodiment of the present invention.

Referring next to FIG. 15, there will be described a second embodiment of the present invention, which relates to a CC feeder 360 which may be employed in the CC supplying device 10 shown in FIG. 1. The CC feeder 360 employs a belt driving device 362 including an electric motor 368 (e.g. a servomotor or a stepper motor) and a small-diameter and a large-diameter gear 370, 372, for circulating a CC-carry belt 382, in place of the belt driving device 290 employed in the CC feeder 12 shown in FIG. 2. The small-diameter gear 370 is fixed to an output shaft of the electric motor 368, and is meshed with the large-diameter gear 372, which in turn is meshed with a drive pulley 374. The drive pulley 374 cooperates with four driven pulleys 376 to support the CC-carry belt 382. The drive and driven pulleys 374, 376 are supported by the first member 54. The electric motor 368 is controlled by the control device 300 (FIG. 2) with respect to its rotation amount or angle in each of its forward and backward directions. Except for the above-described technical features of the CC feeder 360, the CC feeder 360 is similar to the CC feeder 12.

The control device 300 controls the electric motor 368 to circulate the CC-carry belt 382 in its forward direction by a first predetermined amount sufficient for the leading one of the CCs 110 arranged in the single array to be stopped by the stopper 208, and subsequently circulates the belt 382 in its backward direction by a second predetermined amount smaller than the first predetermined amount so that the leading CC 110 is moved away from the stopper 208.

While the present invention has been described in its preferred embodiments, the present invention may otherwise be embodied.

For example, although in each of the illustrated embodiments the air is blown when the CCs 110 are fed by the CC-carry surface 184 after the leading CC 110 is taken out, it is possible to blow the air before the taking-out of the leading CC 110. In the latter case, the air is blown when the CC sucking head 22 is lowered, the CC-carry surface 184 is moved rearward, and the leading CC 110 is moved away from the stopper 208. The blowing of the air is stopped before the sucking head 22 contacts and sucks the leading CC 110.

While in each of the illustrated embodiments the air is blown only one time while the CCs 110 are fed on the CC-carry surface 184 after the leading CC 110 is taken out, it is possible to blow the air two or more times. Otherwise, it is possible to blow the air while the leading CC 110 is taken out, as well. In the latter cases, the CCs 110 are well stirred in each of the first and second CC-stir rooms 116, 118 and the CC-stir passage 132. If the CC-carry surface 184 has a sufficient space for supporting another CC 110 when the CCs 110 are stirred by the air blown into the CC-supply passage 134, one CC 110 is fed from the passage 134 onto the surface 184; but if not, no CC 110 is fed onto the surface 184. Since the CC-carry surface 184 has a considerably high friction coefficient, it is impossible that the CC 110 fed from the CC-supply passage 134 to the surface 184 push the array of CCs 110 frontward on the surface 184, press the leading CC 110 against the stopper 208, or prevent the leading CC 100 from being taken out by the CC sucking head 22. Thus, the CCs 100 can be taken out without any problems, even if the air may be blown during the taking-out of each CC 110.

In each of the illustrated embodiments, a CC stirring device including the CC-stir rooms 116, 118 and the CC-stir air-blow holes 136, 138 may be replaced by a CC vibrating device which vibrates the CCs 110 stored in the CC-store case 112, arranges the CCs 110 into a single array of CCs 110, and feeds the array of CCs 110 into the inlet of the CC-supply passage 134. However, it is preferred that the CC vibrating operation of the CC vibrating device be stopped during a time period from the time when the CC-carry belt 182 is driven to move the CC-carry surface 184 backward to the time when the leading CC 110 is taken out.

In each of the illustrated embodiments, each CC feeder 12 drives the CC-carry belt 182 by a predetermined mount or distance in its forward direction for causing the leading CC 110 to strike against the stopper 208. Each CC feeder 12 may be adapted to be able to adjust the predetermined distance. In the latter case, the predetermined distance is adjusted, for example, in the case where the CC feeder 12 feeds, after having fed a sort of CCs 110 having certain dimensions, another sort of CCs 110 having different dimensions. In the first embodiment shown in FIG. 2, the predetermined distance is adjusted, for example, by adjusting the position where the drive lever 260 is connected to the elevator link 276. In the case where the elevator link 276 is driven by a drive device including its exclusive drive source, the predetermined distance is adjusted by adjusting the amount (i.e., distance) of downward movement of the elevator link 276. The second member 56 may be replaced by another second member having dimensions corresponding to the dimensions of the new sort of CCs 110; and the fourth member 60 (i.e., the fixed cover member) may be replaced by another fourth member having a guide groove and a recess or CC-take-out space having respective widths corresponding to the width of the new sort of CCs 110. In addition, it is possible to adapt the CC feeder 12 to be able to adjust the position where the leading CC 110 is stopped by the stopper 208, and the angular position where the rotation of the ratchet wheel 220 in its forward direction is stopped by the stopper 232. In the last case, the CC sucking head 22 can contact and suck the center of each of different sorts of CCs 110 having different dimensions. In the second embodiment shown in FIG. 15, the control device 300 may be programmed to adjust the predetermined distance depending upon the dimensions of each sort of CCs 110.

In each of the illustrated embodiments, the CC feeders 12 are used for supplying the CCs 110 to the CC mounting device 14 which includes the CC sucking heads 22, intermittently rotates those heads 22 about the common axis line so that the heads 22 suck the CCs 110 from the feeders 12, and mounts the CCs 110 sucked by the heads 22, on the PCB 18 as the circuit substrate. Otherwise, the CC feeders 12 may be used for supplying the CCs 110 to a different CC mounting device which includes a rotatable table for supporting a plurality of CC sucking heads, and a rotating device for rotating the rotatable table by any desired angle so that the CC sucking heads suck the CCs 110 from the feeders 12 and mount the CCs 110 on the PCB 18; or another or second different CC mounting device as disclosed in U.S. Pat. No. 5,926,950. The second different CC mounting device includes a plurality of rotary members which are individually rotatable about a common axis line; a rotary-motion applying device which applies a rotation motion to each of the rotary members such that each rotary member is stopped one or more times during its full rotation about the common axis line and keeps a predetermined time difference between its preceding rotary member and each rotary member itself and between each rotary member itself and its following rotary member; and a plurality of CC holding heads which are supported by the plurality of rotary members, respectively, and each of which can hold a CC 110. Moreover, the CC feeders 12 may be used for supplying the CCs 110 to another CC mounting device which is linearly movable in one direction for sucking and mounting the CCs 110; or yet another CC mounting device which is linearly movable in each of two directions perpendicular to each other in one plane, for sucking and mounting the CCs 110.

In each of the illustrated embodiments, the CC supplying device 10 includes the plurality of CC feeders 12 which are attached to the X-axis slide 44 as a movable table such that the respective CC-supply (CC-take-out) portions of the CC feeders 12 are arranged along one straight common line, and the table moving device 40, 42, 36, 48, 50 which moves the table 44 in a direction parallel to the straight common line so that the respective CC-supply portions of the CC feeders 12 are sequentially positioned at the CC supplying position where each of the feeders 12 supplies one or more CCs 110 from its CC-supply portion. However, the CC feeders 12 may be attached to the movable table 44 such that the respective CC-supply portions of the feeders 12 are arranged along a circular (i.e., full-circular) line or an arcuate (i.e., part-circular) line as disclosed in U.S. patent application Ser. No. 09/061,177, filed on Apr. 17, 1998, assigned to the Assignee of the present application, or a curve other than the full- or part-circular line, or any combination of two or more of those lines. In the case of the straight common line, the movable table is a linearly movable table; in the case of the full-circular common line, the movable table is a full-circular table which is rotatable about an axis line; and in the case of the part-circular common line, the movable table is a sectorial table which is rotatable about an axis line. Each of the full-circular table and the sectorial table is a rotary table which is rotatable about an axis line.

In each of the illustrated embodiments, the CC supplying device 10 includes the plurality of CC feeders 12 which are attached to the X-axis slide 44 as a movable table and which, therefore, are movable with the movable table 44. However, it is possible that the CC supplying device 10 employ a plurality of stationary CC feeders, depending upon the sort of the CC mounting device to which the CC supplying device 10 supplies the CCs 110. Otherwise, it is possible that the CC supplying device 10 employ at least one CC feeder which is attached a movable table which is movable in each of two directions perpendicular to each other in one plane. In the last case, the CC feeder or feeders are movable in each of the two directions for supplying CCs 110 to a CC mounting device.

In the first embodiment shown in FIG. 2, the elevator link 276 of the drive mechanism of the belt driving device 290 is driven by the driving device including the elevator member 294 and the index-table servomotor 26 as its drive source. However, the driving device may be replaced by a different driving device including an exclusive drive source independent of the servomotor 26. The different driving device including its exclusive drive source may be one which includes a drive member, like the elevator member 294, which is movable up and down for moving the elevator link 276 up and down; or one which includes a drive member which is pivotable for moving the elevator link 276 up and down. The different driving device may be one which is common to two or more CC feeders, or one which is exclusive for each CC feeder.

In each of the illustrated embodiments, the elevating and lowering device 164 as the joint-member driving device for connecting and disconnecting the joint member 158 to and from the joint member 148 may use the index-table servomotor 26 as its drive source. In this case, it is preferred, but is not essentially required, that in the case where one CC feeder 12 successively feeds two or more CCs 110, the joint member 158 remain connected to the joint member 148 of the one feeder 12 while that feeder 12 successively supplies the CCs 110.

It is to be understood that the present invention may be embodied with other changes, improvements, and modifications that may occur to those skilled in the art without departing from the scope and spirit of the invention defined in the appended claims.

What is claimed is:

1. A method of supplying a plurality of circuit components, comprising the steps of:

lining up, on a component-carry surface of an endless belt, the circuit components in a lengthwise direction of the component-carry surface such that the lined-up components are close to each other, circulating the belt in one of opposite directions so that the component-carry surface is moved in a forward direction toward a stopper and a leading one of the lined-up components is stopped by the stopper, and circulating the belt in the other direction so that the component-carry surface carrying the circuit components including the leading component is moved by a predetermined distance in a backward direction away from the stopper and the leading component is moved away from the stopper.

2. A circuit-component feeder, comprising:

an endless belt having an outer surface a portion of which provides a component-carry surface;

a stopper disposed adjacent to the component-carry surface;

a component lining-up device which lines up, on the component-carry surface, a plurality of circuit components in a lengthwise direction of the component-carry surface such that the lined-up components are close to each other; and a belt driving device which circulates the belt in one of opposite directions thereof by a first predetermined amount sufficient for a leading one of the lined-up components to be moved and stopped by the stopper, and subsequently circulates the belt in the other direction thereof by a second predetermined amount smaller than the first predetermined amount, so that the component-carry surface carrying the circuit components including the leading component is moved by the second predetermined distance in said other direction away from the stopper and the leading component is moved away from the stopper.

3. A circuit-component feeder, comprising:

an endless belt having an outer surface a portion of which provides a component-carry surface;

a stopper disposed adjacent to the component-carry surface;

a component lining-up device which lines up, on the component-carry surface, a plurality of circuit components in a lengthwise direction of the component-carry surface such that the lined-up components are close to each other; and a belt driving device which circulates the belt in one of opposite directions thereof by a first predetermined amount sufficient for a leading one of the lined-up components to be moved and stopped by the stopper, and subsequently circulates the belt in the other direction thereof by a second predetermined amount smaller than the first predetermined amount, so that the component-carry surface carrying the circuit components including the leading component is moved by the second predetermined distance in said other direction away from the stopper and the leading component is moved away from the stopped wherein the belt driving device comprises:

a drive pulley on which the endless belt is wound;

a ratchet wheel which is associated with the drive pulley such that respective rotations of the ratchet wheel in opposite directions thereof are transmitted to the drive pulley;

a driving mechanism which includes a pivotable member which is pivotable in opposite directions thereof and thereby reciprocatable for rotating the ratchet wheel in one of the opposite directions thereof, and a driving pawl which is supported by the pivotable member and which engages teeth of the ratchet wheel such that when the pivotable member is pivoted in one of the opposite directions thereof, the driving pawl does not move over any of the teeth of the ratchet wheel so that the ratchet wheel is rotated in said one direction thereof and, when the pivotable member is pivoted in the other direction thereof, the driving pawl moves over at least one of the teeth of the ratchet wheel so that the ratchet wheel is not rotated; and a positioning pawl which engages the teeth of the ratchet wheel to rotate the ratchet wheel in the other direction thereof to an angular position away by a predetermined angle from an angular position to which the ratchet wheel is rotated in said one direction thereof by the driving mechanism.

4. A circuit-component feeder according to claim 3, wherein the pivotable member comprises a first pivotable member which is pivotable about a first axis line about which the ratchet wheel is rotatable, and the driving pawl is attached to the first pivotable member such that the driving pawl is pivotable about a second axis line parallel to the first axis line, wherein the driving mechanism further comprises a first biasing device which biases the driving pawl in a direction to engage the teeth of the ratchet wheel, and wherein the belt driving device further comprises a second pivotable member which is pivotable about a third axis line parallel to the first axis line and which supports the positioning pawl; and a second biasing device which biases the second pivotable member in a direction in which the positioning pawl engages the teeth of the ratchet wheel.

5. A circuit-component feeder according to claim 3, wherein the drive pulley and the ratchet wheel are provided by an integral rotatable member.

6. A circuit-component feeder, comprising:
   an endless belt having an outer surface a portion of which provides a component-carry surface;
   a stopper disposed adjacent to the component-carry surface;
   a component lining-up device which lines up, on the component-carry surface, a plurality of circuit components in a lengthwise direction of the component-carry surface such that the lined-up components are close to each other; and
   a belt driving device which circulates the belt in one of opposite directions thereof by a first predetermined amount sufficient for a leading one of the lined-up components to be moved and stopped by the stopper, and subsequently circulates the belt in the other direction thereof by a second predetermined amount smaller than the first predetermined amount, so that the component-carry surface carrying the circuit components including the leading component is moved by the second predetermined amount in said other direction away from the stopper and the leading component is moved away from the stopper,
   wherein the belt driving device comprises:
   a drive pulley on which the endless belt is wound; and
   an electric motor which is selected from the group consisting of a servomotor and a stepper motor, which is rotatable in each of opposite directions thereof and is controllable with respect to a rotation amount in said each of the opposite directions thereof and which rotates the drive pulley in opposite directions thereof corresponding to the opposite directions of the belt, respectively, by respective amounts corresponding to the first and second predetermined amounts.

7. A circuit-component feeder according to claim 6, wherein the belt driving device further comprises a control device which controls the electric motor to rotate the drive pulley such that the belt is circulated in said one direction thereof by the first predetermined amount end is subsequently circulated in said other direction thereof by the second predetermined amount smaller than the first predetermined amount.

8. A circuit-component feeder according to claim 2, wherein the component-carry surface of the endless belt comprises an upper surface of an upper flat portion of the endless belt, and wherein the feeder comprises a main body which has a pair of belt guide surfaces which guide opposite side surfaces of the flat portion of the belt, respectively; a belt support surface which supports a lower surface of the flat portion of the belt which is opposite to the component-carry surface thereof; and a pair of component guide surfaces which guide opposite side surfaces of each of the circuit components lined up on the component-carry surface, the opposite side surfaces of said each circuit component being parallel to a direction in which said each circuit component is moved by the belt.

9. A circuit-component feeder according to claim 8, wherein the main body comprises a main member which has a first guide groove which opens upward and has a rectangular cross section, the belt guide surfaces comprising opposed surfaces of the main member which are opposed to each other and cooperate with each other to define the guide groove, the belt support surface comprising a bottom surface which cooperates with the opposed surfaces to define the first guide groove, and wherein the main body further comprises a fixed cover member which is fixed to the main member to cover an upper opening of the first guide groove, the fixed cover member having a second guide groove which opens in a surface thereof opposed to the first guide groove, the component guide surfaces comprising opposed surfaces of the fixed cover member which are opposed to each other and cooperate with each other to define the second guide groove.

10. A circuit-component feeder according to claim 2, further comprising:
   a movable cover member which normally takes a closed position where the movable cover member covers a portion of the component-carry surface of the endless belt which is adjacent to the stopper and takes, when each of the circuit components is taken from the feeder, an opened position where the movable cover member permits said each circuit component to be taken from the feeder; and
   a moving device which moves the movable cover member to each of the closed position and the opened position.

11. A circuit-component feeder according to claim 2, wherein the belt comprises a timing belt.

12. A circuit-component feeder according to claim 2, wherein the component lining-up device comprises:
   a storing chamber in which the circuit components to be supplied are stored in bulk, the storing chamber having an outlet through which the circuit components are fed;
   a supply passage having an inlet and an outlet; and
   an arranging device which is provided between the storing device and the supply passage and which arranges the circuit components fed from the outlet of the storing device, into an array of the components, and supplies the array of the components to the inlet of the supply passage.

13. A circuit-component feeder according to claim 12, wherein the arranging device comprises a component-stirring air blower which blows air for stirring the in-bulk circuit components and thereby arranging the circuit components into the array of the components.

14. A circuit-component feeder according to claim 12, wherein the arranging device comprises:
   at least one component-stirring room which is provided between the outlet of the storing device and the inlet of the supply passage; and
   a component-stirring air blower which has, near the inlet of the supply passage, at least one opening for blowing air in a direction having a component toward the component-stirring room and thereby stirring the in-bulk circuit components.

15. A circuit-component feeder according to claim 12, wherein the arranging device comprises a component-feeding air blower having at least one opening which opens in the supply passage and which blows air in a direction having a component toward the outlet of the supply passage.

16. A circuit-component feeder according to claim 15, wherein the component lining-up device further comprises an air reliever which is provided between the component-feeding air blower and the outlet of the supply passage and which relieves the air blown by the air blower, into an outside space, the air reliever being different from a space left between the circuit components and the supply passage.

17. A circuit-component feeder according to claim 16, wherein the air reliever comprises at least one air-relieving hole which is formed through a thickness of a wall defining the supply passage and which communicates the supply passage with the outside space.

18. A circuit-component feeder according to claim 3, further comprising a movable cover member which normally covers a portion of the component-carry surface of the endless belt that is adjacent to the stopper and which is opened, when each of the circuit components is taken from the feeder, to permit said each circuit component to be taken from the feeder; and a synchronizing mechanism which synchronizes the opening of the movable cover member with the pivotal movement of the pivotable member in said other direction thereof.

19. A circuit-component supplying apparatus, comprising:

an endless belt having an upper surface a portion of which provides a component-carry surface;

a stopper disposed adjacent to the component-carry surface;

a component lining-up device which lines up, on the component-carry surface, a plurality of circuit components in a lengthwise direction of the component-carry surface such that the lined-up components are close to each other;

a belt driving device which circulates the belt in one of opposite directions thereof by a first predetermined amount sufficient for a leading one of the lined-up components to be moved and stopped by the stopper, and subsequently circulates the belt in the other direction thereof by a second predetermined amount smaller than the first predetermined amount, so that the component-carry surface carrying the circuit components including the leading component is moved by the second predetermined distance in said other direction away from the stopper and the leading component is moved away from the stopper; and a suction device which sucks an upper surface of the leading component and takes the leading component off the component-carry surface in an upward direction.

20. A circuit-component feeder, comprising:

an endless belt having an outer surface a portion of which provides a component-carry surface;

a stopper disposed adjacent to the component-carry surface;

a component lining-up device which lines up, on the component-carry surface, a plurality of circuit components in a lengthwise direction of the component-carry surface such that the lined-up components are close to each other; and a belt driving device which circulates the belt in one of opposite directions thereof by a first predetermined amount sufficient for a leading one of the lined-up components to be moved and stopped by the stopper, and subsequently circulates the belt in the other direction thereof by a second predetermined amount smaller than the first predetermined amount, so that the component-carry surface carrying the circuit components including the leading component is moved by the second predetermined amount in said other direction away from the stopper and the leading component is moved away from the stopper, wherein the belt driving device comprises:

a drive pulley on which the endless belt is wound; and a ratchet wheel which has a plurality of teeth and which is associated with the drive pulley such that respective rotations of the ratchet wheel in opposite directions thereof are transmitted to the drive pulley;

a first pivotable member which is pivotable in opposite directions thereof about a first axis line about which the ratchet wheel is rotatable;

a driving pawl which is supported by the first pivotable member such that the driving pawl is pivotable about a second axis line parallel to the first axis line, and which engages the teeth of the ratchet wheel such that when the first pivotable member is pivoted in one of the opposite directions thereof, the driving pawl supported by the first pivotable member does not move over any of the teeth of the ratchet wheel so that the ratchet wheel engaged with the driving pawl is rotated in one of the opposite directions thereof and, when the first pivotable member is pivoted in the other direction thereof, the driving pawl moves over at least one of the teeth of the ratchet wheel so that the ratchet wheel is not rotated;

a first biasing device which biases the driving pawl in a direction to engage the teeth of the ratchet wheel;

a positioning pawl which engages the ratchet wheel such that, at an end of the pivotal movement of the first pivotable member in said one direction thereof, a space remains between the positioning pawl and an upstream one of two adjacent teeth of the ratchet wheel as seen in the other direction thereof, and the positioning pawl engages the other, downstream tooth;

a second pivotable member which is pivotable about a third axis line parallel to the first and second axis lines and which supports the positioning pawl; and a second biasing device which biases the second pivotable member in a direction in which the positioning pawl supported by the second pivotable member engages the teeth of the ratchet wheel, so that when the first pivotable member is pivoted in said, other direction thereof from said end of the pivotal movement thereof in said one direction thereof, the positioning pawl engages, in addition to said downstream tooth of the ratchet wheel, said upstream tooth thereof, and rotates the ratchet wheel in said other direction thereof to an angular position away by a predetermined angle from an angular position to which the ratchet wheel is rotated in said one direction thereof by the driving pawl, said predetermined angle corresponding to said second predetermined amount.

* * * * *